(12) United States Patent
Hwang et al.

(10) Patent No.: US 6,277,251 B1
(45) Date of Patent: Aug. 21, 2001

(54) APPARATUS AND METHOD FOR SHIELDING A DIELECTRIC MEMBER TO ALLOW FOR STABLE POWER TRANSMISSION INTO A PLASMA PROCESSING CHAMBER

(75) Inventors: Jeng H. Hwang, Cupertino; Steve S. Y. Mak, Pleasanton; Yan Ye, Campbell, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/515,695

(22) Filed: Feb. 29, 2000

Related U.S. Application Data

(63) Continuation of application No. 08/920,283, filed on Aug. 26, 1997, now abandoned.

(51) Int. Cl.[7] .......................... C23C 14/34; C23C 16/00; C03C 15/00
(52) U.S. Cl. ............... 204/192.33; 204/192.13; 216/67; 427/569; 427/585
(58) Field of Search ................. 204/298.06, 298.08, 204/298.11, 192.12, 192.13, 192.33; 156/345; 118/723 IR; 216/67, 68, 59; 427/569, 585

(56) References Cited

U.S. PATENT DOCUMENTS 5,110,408   5/1992   Fujii et al. ...................... 156/643

(List continued on next page.)

FOREIGN PATENT DOCUMENTS

| 0 421 348 A1 | 4/1991 | (EP) . |
|---|---|---|
| 0 650 182 A1 | 4/1995 | (EP) . |
| 07221070 Pul. Number | 8/1995 | (EP) . |
| 0 727 807 A1 | 8/1996 | (EP) . |
| 0 732 729 A2 | 9/1996 | (EP) . |
| 0 732 729 A3 | 9/1996 | (EP) . |
| 0 838 841 A2 | 4/1998 | (EP) . |

OTHER PUBLICATIONS

Lee et al., "Patterning of Pt thin films using $SiO_2$ mask in a high density plasma," *Journal of the Korean Institute of Telematics & Electronics*, 34D(3):87–92 (1997).

(List continued on next page.)

*Primary Examiner*—Nam Nguyen
*Assistant Examiner*—Gregg Cantelmo
(74) *Attorney, Agent, or Firm*—Shirley L. Church

(57) ABSTRACT

An assembly for allowing stable power transmission into a plasma processing chamber comprising a dielectric member; and at least one material deposition support assembly secured to the dielectric member for receiving and supporting the deposition of materials during processing of a substrate and a chamber having a controlled environment and containing a plasma of a processing gas. A plasma reactor for processing substrates having a reactor chamber including a chamber sidewall and a dielectric window supported by the chamber sidewall. A plurality of deposition support members is coupled to an inside surface of the dielectric window for receiving and supporting a deposition of materials during processing of substrates. In an alternative embodiment of the invention, the plurality of deposition support members is connected to a liner assembly instead of to the dielectric window. The liner assembly is supported by the chamber sidewall. A pedestal is disposed in the reactor chamber for supporting substrates, such as semiconductor wafers, in the reacting chamber. The plasma reactor also includes a processing power source, a processing power gas-introducing assembly for introducing processing gas into the reactor chamber, and a processing power-transmitting member for transmitting power into the reactor interior to aid in sustaining a plasma from the processing gas within the reacting chamber. A method for adjusting the density of plasma contained in a chamber wherein substrates are to be processed. A method of processing (e.g. etching or depositing) a metal layer disposed on a substrate.

23 Claims, 27 Drawing Sheets

U.S. PATENT DOCUMENTS

| | | | |
|---|---|---|---|
| 5,419,029 | 5/1995 | Raaijmakers | 29/447 |
| 5,569,363 | 10/1996 | Bayer et al. | 204/192.32 |
| 5,599,403 * | 2/1997 | Kariya et al. | 438/488 |
| 5,614,055 | 3/1997 | Fairbairn et al. | 156/345 |
| 5,641,375 | 6/1997 | Nitescu et al. | 156/345 |
| 5,685,941 | 11/1997 | Forster et al. | 156/345 |
| 5,686,339 | 11/1997 | Lee et al. | 437/52 |
| 5,753,044 | 5/1998 | Hanawa et al. | 118/723 |
| 5,763,581 * | 6/1998 | Forster et al. | 156/345 |
| 5,800,688 | 9/1998 | Lantsman et al. | 204/298.11 |
| 5,837,057 | 11/1998 | Koyama et al. | 118/723 |
| 6,006,694 | 12/1999 | DeOrnellas et al. | 118/723 |

OTHER PUBLICATIONS

Sony Corp., *Patent Abstracts of Japan*, vol. 1995, No. 11, (Dec. 1995), No. JP 07 221070, Published Aug. 18, 1995.

Article entitled "Plasma Sources for Thin Film Deposition and Etching" by Lieberman et.al. from vol. 18 of "Physics of Thin Filims".

* cited by examiner

APPARATUS AND METHOD FOR SHIELDING A DIELECTRIC MEMBER TO ALLOW FOR STABLE POWER TRANSMISSION INTO A PLASMA PROCESSING CHAMBER

This is a continuation patent application of patent application Ser. No. 08/920,283, filed Aug. 26, 1997, now abandoned.

BACKGROUND OF THE INVENTION 1. Field of the Invention

This invention relates to an apparatus and method for processing (e.g. etching, chemical or physical vapor deposition, etc.) a substrate in a chamber containing a plasma. More specifically, this invention provides an apparatus and method for plasma processing of a semiconductor wafer. This invention allows a generally stable processing power (e.g. radio frequency (RF) processing power) to pass through a dielectric member and into a chamber of a plasma processing apparatus such that an essentially stable and uniform processing (e.g. etch rate) on semiconductor wafers may be maintained over a desired period of time. 2. Description of the Prior Art It is well known that various magnetically enhanced radio frequency (RF) diodes and triodes have been developed to improve performance of plasma reactors. As mentioned in an article entitled "Design of High-Density Plasma Sources" by Lieberman et al from Volume 18 of "Physics of Thin Films", copyright 1994 by Academic Press Inc. of San Diego, Calif., these include by way of example only, the Applied Materials AMT-5000 magnetically enhanced reactive ion etcher and the Microelectronics Center of North Carolina's split cathode RF magnetron. Magnetically enhanced reaction ion etchers (MERIE) apply a dc magnetic field of 50–100 Gauss (G) parallel to the powered electrode which supports a semiconductor wafer. The dc magnetic field enhances plasma confinement, resulting in a reduced sheath voltage and an increased plasma density when the magnetic field is applied. However, the plasma generated in MERIE systems is strongly nonuniform both radially and azimuthally. It is well known that in order to increase process uniformity, at least azimuthally, the magnetic field is rotated in the plane of the semiconductor wafer at a certain frequency, e.g. 0.5 Hz. While this is an improvement, MERIE systems still do not have the desired uniformity and high density in the generated plasma, which may limit the applicability of MERIE systems to next-generation, submicron device fabrication.

The limitations of RF diodes and triodes and their magnetically enhanced variants have led to the development of reactors operating at low pressures with high-efficiency plasma sources. These reactors can generate a higher density plasma and have a common feature in that processing power (e.g. RF power and/or microwave power) is coupled to the plasma across a dielectric window, rather than by direct connection to an electrode in the plasma, such as for an RF diode. Another common feature of these reactors is that the electrode upon which the wafer is placed can be independently driven by a capacitively coupled RF source. Therefore, independent control of the ion/radical fluxes through the source power and the ion bombarding energy through the wafer electrode power is possible.

While the limitations of RF diodes and triodes and their magnetically enhanced variants have motivated the development of high-density plasma reactors with low pressures, high fluxes, and controllable ion energies, these developed high-density plasma reactors have a number of challenges. One challenge is the inability of high-density plasma reactors to achieve the required process uniformity over 200–300 mm wafer diameters. High density sources are typically cylindrical systems with length-to-diameter usually exceeding unity. In such cylindrical systems plasma formation and transport is inherently radially nonuniform.

Another challenge is that the deposition of materials on the dielectric window during etching of semiconductor wafers in a process chamber has necessitated frequent and costly reactor cleaning cycles. This is especially true when metals, such as platinum, copper, aluminum, titanium etc., are etched or deposited in the production of integrated circuit (IC) devices. After a metal layer on a substrate has been etched or deposited for a period of time, the etch or deposit rate on the metal may decrease. The dropping in metal etch or deposit rate is due to the build up of conductive by-products deposited on the dielectric window. Such deposited conductive by-products behave as a Faraday shield to reduce the efficiency of rf energy transmission into the plasma by blocking the rf energy transmission through the dielectric window. Thus, there is no stable power transmission into the plasma processing chamber; and there is no efficient power transfer across dielectric windows over a wide operating range of plasma parameters.

Therefore, what is needed and what has been invented is a method for adjusting the density of plasma in a plasma processing chamber in proximity to a certain situs on a surface (i.e. an inside or outside surface) of the dielectric window. What is further needed and what has been invented is an assembly for allowing stable power transmission into a plasma processing chamber over a long period of time during processing of a substrate (i.e. semiconductor wafer) contained within the plasma processing chamber. The substrate supports a metal layer which is etched or deposited when processing power (e.g. RF power) is passed through a dielectric window and into a processing chamber containing the substrate and a plasma of the processing gas.

SUMMARY OF THE INVENTION

The present invention accomplishes its desired objects by broadly providing an assembly for allowing stable power transmission into a plasma processing chamber comprising a member (i.e. a dielectric member consisting of a generally non-conductive material); and a means, coupled to the member, for preventing the deposition of materials on the dielectric member from becoming generally continuous during processing (e.g. etching, chemical vapor deposition, physical vapor deposition, etc.) of a substrate in a chamber containing a plasma of a processing gas. The dielectric member (e.g. a dielectric window) preferably possesses a dome-shaped configuration and may be formed from any non-conductive material such as ceramic. In one embodiment of the invention the means for preventing the deposition of materials on the member from becoming generally continuous during processing of a substrate in a chamber containing a plasma comprises a means, coupled to the dielectric member, for receiving and supporting the deposition of materials at a location spaced from the dielectric member. The means for receiving and supporting the deposition of material at a location spaced from the dielectric member comprises at least one deposition support assembly secured to the dielectric member for receiving and supporting the deposition of materials during processing of a substrate in a chamber having a controlled environment and containing a plasma of a processing gas. The at least one deposition support assembly preferably comprises at least one deposition support member coupled to an inside surface of the dielectric member, more preferably the at least one deposition support member comprises a plurality of deposition supports and a plurality of brace members secured to the deposition supports and to the dielectric member to position the deposition supports in a spaced relationship with respect to the dielectric member. The plurality of deposition support members includes a plurality of overlapping and spaced deposition support members. The brace members vary in length such that at least two contiguous deposition support members include an overlapping and spaced relationship with respect to each other.

The material deposition support assembly including the deposition support members and the brace members may be manufactured from any suitable material including metal, plastic, non-conductive materials such as rubber, etc. Therefore, the material deposition support assembly comprises a material selected from the group consisting of a generally nonconductive material, a generally conductive material, and mixtures thereof. More specifically, the deposition support members and the brace members may each comprise a material selected from the group consisting of a generally nonconductive material, a generally conductive material, and mixtures thereof. A deposit of a material is supported by the material deposition support assembly including the deposition support members. The deposit of material is by-products from processing substrates in a chamber having a controlled environment and containing a plasma of a processing gas. The deposit of material would typically be an element or compound selected from the group consisting of metal, metal oxide, metal nitride, and mixtures thereof; and the metal would typically be a metal selected from the group consisting of platinum, copper, aluminum, titanium, ruthenium, iridium and mixtures thereof. In an alternative embodiment of the invention an assembly, preferably a metal assembly, may be situated in proximity to a certain situs on an outside surface of the dielectric member for interfering (e.g. diverting, absorbing, disrupting, etc.) with processing power before it passes through the dielectric member in order to adjust the density of the plasma of the processing gas at a location within a processing chamber. The metal assembly may be secured to an outside surface of the dielectric member, or if desired the metal assembly may spaced from the certain situs including being supported by a structure other than the dielectric member. The metal assembly functions as a shield, diverter or absorber to selectively block, divert or absorb some of the processing power before it passes through the dielectric member.

The present invention further accomplishes its desired objects by broadly providing a plasma reactor for processing (e.g. etching, chemical vapor deposition, physical vapor deposition, etc.) substrates comprising a reactor chamber including a chamber wall and a dielectric window supported by the chamber wall. In one embodiment of the present invention, a plurality of deposition support members is coupled to an inside surface of the dielectric window for receiving and supporting a deposition of materials during processing of substrates. In another embodiment of the present invention, a liner assembly is supported by the chamber wall and has a plurality of the deposition support members coupled thereto for receiving and supporting the deposition of the materials. A pedestal is disposed in the reactor chamber for supporting substrates therein. The plasma reactor also includes a processing power source and a processing gas-introducing assembly engaged to the reactor chamber for introducing a processing gas into the reactor chamber. A processing power-transmitting member is disposed in proximity to the reactor chamber and is connected to the processing power source for transmitting power into the interior of the reactor to aid in sustaining a plasma from a processing gas within the reactor chamber. The deposition support members are overlapping and spaced. The processing power source may be any suitable processing power source, preferably one or more selected from a microwave power source, a power that employs a magnetron power source, and an RF power source. The processing power-transmitting member may be any suitable processing power-transmitting member such as a coiled inductor and/or an antenna.

In another embodiment of the plasma reactor for processing substrates, there is provided an inductively coupled RF plasma reactor for processing semiconductor wafers comprising a reactor chamber having a chamber wall and a dome-shaped ceiling supported by the chamber wall. A plurality of deposition support members is coupled to an inside surface of the dome-shaped ceiling for receiving and supporting the deposition of materials during processing of semiconductor wafers. A wafer pedestal is disposed in the reactor chamber for supporting semiconductor wafers in the reactor chamber. An inductively coupled RF power source is provided, and a means, engaged to the reactor chamber, is provided for introducing a processing gas into the reactor chamber. The inductively coupled RF plasma reactor also includes a coil inductor adjacent to the reactor chamber and connected to the RF power source and a bias RF source connected to the wafer pedestal. The means for introducing a processing gas (i.e. a processing gas-introducing assembly) may be any suitable means such as a high pressure gas cylinder/flow meter assembly communicating with an inlet in the chamber wall of the reactor chamber. The bias RF source is independent of the inductively coupled RF power source such that respective RF power levels applied to the coil inductor and to the wafer pedestal are independently adjustable.

The present invention also further accomplishes its desired objects by broadly providing a method for adjusting the density of plasma contained in a chamber wherein substrates are to be processed comprising the steps of:

a) providing a chamber containing a plasma processing gas for processing at least one substrate and including a chamber wall having a dielectric member releasably engaged thereto;

b) introducing processing power through the dielectric member and into the chamber of step (a) to process at least one substrate in the plasma processing gas having a plasma density;

c) determining that the plasma density of step (b) for processing at least one substrate should be or is to be adjusted at a location in the chamber in proximity to a certain situs on an inside surface of the dielectric member;

d) interrupting the introducing of processing power through the dielectric member and into the chamber;

e) removing the dielectric member from engagement with the chamber wall of step (a);

f) securing to said certain situs on the inside surface of the dielectric member of step (c) a material deposition support assembly for receiving and supporting a deposition of materials during processing of at least one substrate in the chamber;

g) connecting the dielectric member of step (f) to the chamber wall for reengaging the chamber wall of step (e) with the dielectric member; and h) reintroducing processing power through the dielectric member of step (g) and into the chamber to process at least one substrate in the plasma processing gas having an adjusted plasma density.

In another embodiment of the method for adjusting the density of plasma contained in a chamber wherein substrates are to be processed, there is provided the method as comprising the following steps:

a) providing a chamber containing a plasma processing gas for processing at least one substrate and including a chamber wall having a dielectric member releasably engaged thereto with a plurality of material deposition support members coupled to an inside surface of the dielectric member for receiving and supporting a deposition of materials during processing of at least one substrate in the chamber;

b) introducing processing power through the dielectric member and into the chamber of step (a) to process at least one substrate in the plasma processing gas having a plasma density and to commence the deposition of materials on the material deposition support members of step (a);

c) determining that the plasma density of the plasma processing gas of step (b) should be or is to be adjusted at a location in the chamber in proximity to a particular material deposition support member having a surface area (e.g. a planar surface area, an arcuate surface area, etc.) and coupled to a certain situs on the inside surface of the dielectric member;

d) interrupting the introducing of processing power through the dielectric member and into the chamber;

e) removing the dielectric member from engagement with the chamber wall of step (a);

f) removing the particular material deposition support member of step (c) from said certain situs on the inside surface of the dielectric member;

g) securing a replacement material deposition support member to the certain situs on the inside surface of the dielectric member to replace the removed particular material deposition support member;

h) connecting the dielectric member of step (g) to the chamber wall for reengaging the chamber wall with the dielectric member; and i) reintroducing processing power through the dielectric member of step (h) and into the chamber to process at least one substrate in the plasma processing gas having an adjusted plasma density at the step (c) location in the chamber.

In the immediate foregoing method for adjusting the density of plasma, the replacement material deposition support member of step (g) has a surface area (e.g. a planar surface area, an arcuate surface area, etc.) that differs from the surface area of the particular material deposition support member of step (c). In one embodiment of the invention, the replacement material deposition support member of step (g) has a surface area that is larger than the surface area of the particular material deposition support member of step (c) such that the adjusted plasma density of step (i) is essentially at the step (c) location in the chamber and is less than the step (c) plasma density. In another embodiment of the invention, the replacement material deposition support member of step (g) has a surface area that is smaller than the surface area of the particular material deposition support member of step (c) such that the adjusted plasma density of step (i) is at the step (c) location in the chamber and is greater than the step (c) plasma density. The method for adjusting the density of plasma further includes removing, after the reintroducing step (i), the dielectric member of step (h); and cleaning the deposit of the material from the material deposition support members.

In yet another embodiment of the immediate foregoing method for adjusting the density of plasma, there is provided the method as comprising the following steps:

a) providing a chamber containing a plasma processing gas for processing at least one substrate and including a chamber wall having a dielectric member releasably engaged thereto;

b) introducing processing power through the dielectric member and into the chamber of step (a) to process at least one substrate in the plasma processing gas having a plasma density;

c) determining that the plasma density of step (b) for processing at least one substrate should be or is to be adjusted at a location in the chamber in proximity to a certain situs on an outside surface of the dielectric member;

d) interrupting the introducing of processing power through the dielectric member and into the chamber;

e) situating a processing power-interfering assembly in proximity to said certain situs on the outside surface of the dielectric member of step (c) for engaging and interfering with processing power at the step (c) location in the chamber during processing of at least one substrate in the chamber; and f) reintroducing processing power, after said processing power has engaged and been interfered with by the assembly of step (e), through the dielectric member and into the chamber to process at least one substrate in the plasma processing gas having an adjusted plasma density at the step (c) location in the chamber.

The present invention yet also further accomplishes its desired objects by providing a method for depositing a material on a plurality of material deposition support members during processing of at least one substrate in a chamber containing a plasma processing gas comprising the steps of:

a) providing a chamber containing at least one substrate and a plasma processing gas for processing at least one substrate and including a chamber wall and having a dielectric member releasably engaged thereto with a plurality of overlapping and spaced material deposition support members coupled to an inside surface of the dielectric member such as to cover a majority of the area of the inside surface of the dielectric member for receiving and supporting a deposition of a material during processing of the at least one substrate in the chamber; and b) introducing processing power through the dielectric member and into the chamber of step (a) to process the at least one substrate in the plasma processing gas and to deposit a material on said material deposition support members.

The immediate foregoing method for depositing a material on a plurality of material deposition support members may additionally comprise interrupting the introducing of processing power through the dielectric member and into the chamber; removing the dielectric member from engagement with the chamber wall of step (a); and removing the deposit of the material from the material deposition support members.

The present invention also accomplishes its desired objects by broadly providing a method of processing (e.g. etching or depositing) a metal layer on a substrate comprising the steps of:

a) providing a substrate which receives and/or supports a metal layer;

b) disposing the substrate in a chamber including a chamber wall, a dielectric member releasably engaged to the chamber wall, and a plurality of overlapping and spaced material deposition support members coupled to an inside surface of the dielectric member such as to cover a majority of the area of the inside surface of the dielectric member for receiving and supporting a deposition of a material during processing of the metal layer on the substrate;

c) introducing a processing gas into the chamber of step (b); and d) introducing processing power through the dielectric member and into the chamber of step (b) to process the metal layer on the substrate in a plasma of the processing gas and to deposit a material on the material deposition support members.

It is therefore an object of the present invention to provide an assembly for allowing stable power transmission into a plasma processing chamber.

It is another object of the present invention to provide a plasma reactor for processing substrates.

It is also another object of the present invention to provide an inductively coupled RF plasma reactor for processing semiconductor wafers.

It is yet another object of the present invention to provide a method for adjusting the density of plasma contained in a chamber wherein substrates are to be processed.

It is also yet another object of the present invention to provide a method for depositing a material on a plurality of material deposition support members during processing of at least one substrate in a chamber containing a plasma processing gas.

It is yet a further object of the present invention to provide a method of processing a metal layer on a substrate.

These, together with the various ancillary objects and features which will become apparent to those skilled in the art as the following description proceeds, are attained by this novel assembly and method, a preferred embodiment thereof shown with reference to the accompanying drawings, by way of example only, wherein:

DETAILED DESCRIPTION OF THE INVENTION

Figure 1:
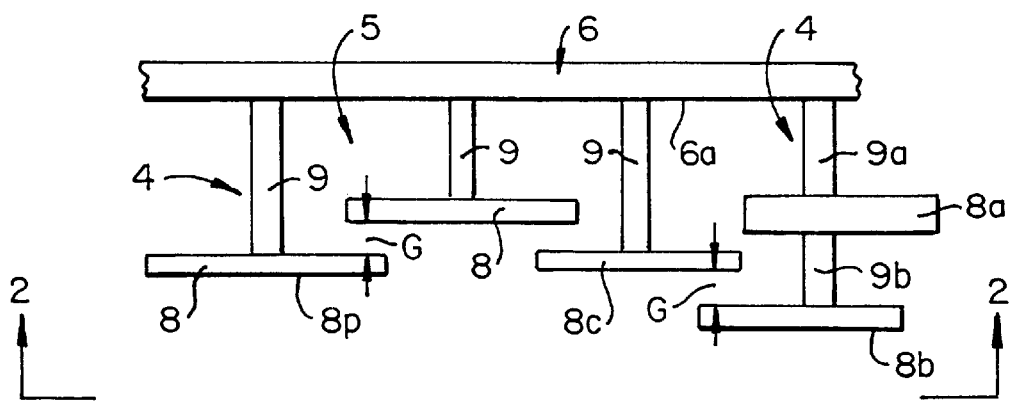
FIG. 1 is a side elevational view of a dielectric member having a plurality of assemblies secured thereto for allowing stable power transmission into a plasma processing chamber.
Figure 2:
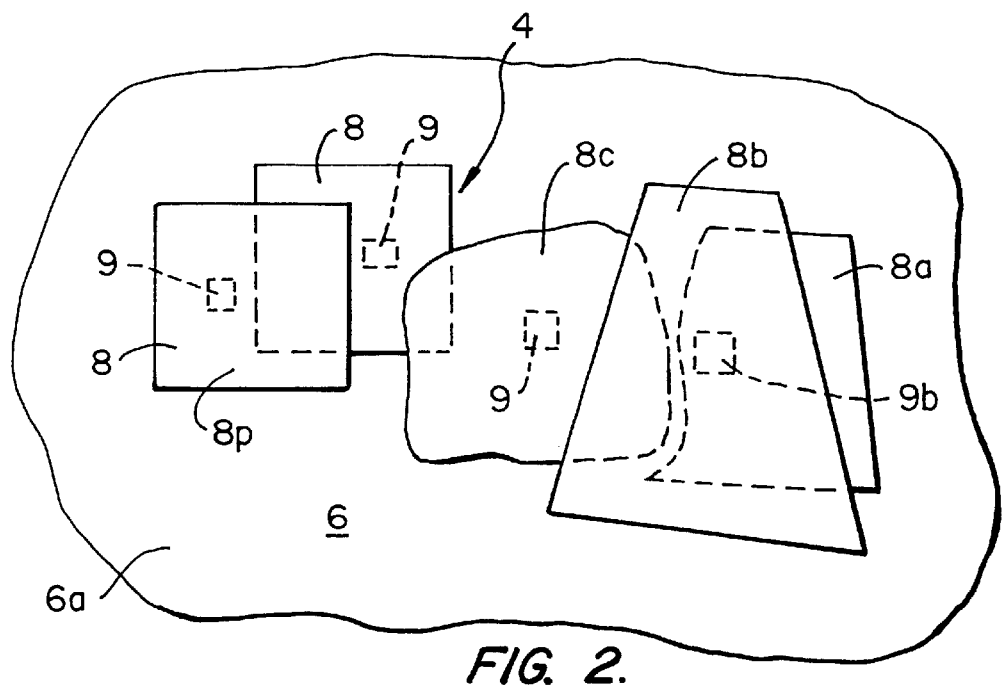
FIG. 2 is a horizontal view taken in direction of the arrows and along the plane of line 2—2 in FIG. 1.
Figure 2A:
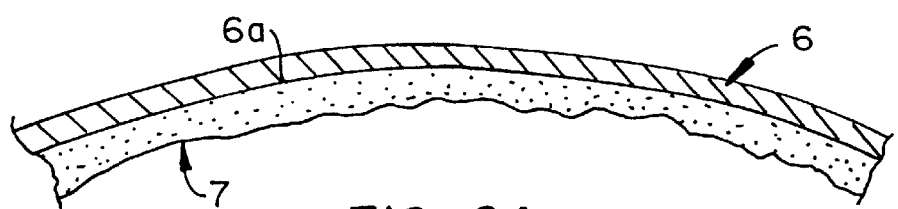
FIG. 2A is a partial vertical sectional view of a dome-shaped dielectric member having a deposit of material thereon, resulting from processing a substrate (e.g. a semi-conductor wafer) in a chamber containing a plasma of a processing gas.

Referring in detail now to the drawings, and initially particularly to FIGS. 1–7, wherein similar parts of the invention are represented by like reference numerals, there is seen an assembly, generally illustrated as 4, for allowing stable power transmission into a process chamber, generally illustrated as 5, having a controlled environment and containing a plasma of a processing gas (e.g. Ar, $N_2$, $Cl_2$, etc.). Substrates, such as semiconductor wafers (identified as "13" below), are processed within the process chamber 5, such as by plasma etching for patterning integrated circuit (IC) metal interconnect devices. Other forms of processing substrates which are included within the spirit and scope of the present invention include chemical vapor deposition and physical vapor deposition. During the plasma process, processing power (e.g. RF power, magnetron power, microwave power, etc.) passes through a dielectric member, generally illustrated as 6 in FIGS. 1–6, which includes a dielectric window of a. nonconductive material such as a ceramic dome, etc., and becomes coupled to a plasma of the processing gas. If the plasma process is plasma etching, metal etching of metals (e.g: platinum, copper, aluminum, titanium, ruthenium, iridium, etc.) is conducted while being supported by substrates. Also during the plasma process, a deposit, generally illustrated as 7, of materials occurs on an inside surface 6a of the dielectric member 6, as shown in FIG. 2A. The deposit 7 is located between the plasma and the power source. If the plasma process for the present invention is plasma etching, the deposit 7 results from etching a metal layer on the substrate; and, thus, the deposit 7 could be electrically conductive, and includes, by way of example only, metal, metal oxide(s), metal nitride(s), etc. The metal corresponds to the metal which is being etched within the process chamber 5 and includes, also by way of example only, platinum, copper, aluminum, titanium, ruthenium, iridium, etc. When deposit 7 is electrically conductive and is between the plasma and the power source, a decay in processing power transmission occurs and continues until the electrically conductive deposit 7 reaches a certain thickness (i.e. skin depth), such as from about 0.001 in. to about 0.5 in., whereafter the processing power transmission becomes very low or even nil. The deposit 7, therefore, behaves as a Faraday shield to reduce the efficiency of processing power transmission into the plasma of the processing gas within the process chamber 5. When processing power transmission through the dielectric member 6 and into the process chamber 5 commences to decline, the processing (e.g. the etch rate) of the metal layer supported by the substrate starts to decline. In order to maintain a generally stable processing power transmission through the dielectric member 6 and into the process chamber 5, and thus maintain a general stable processing of metal layers (e.g. the etch rate on metal layers) supported by substrates which are being processed within the process chamber 5, the assembly 4 is coupled to, or secured to, or integrally formed with, the dielectric member 6 in order to receive and support the deposit 7. The assembly 4 functions to prevent the deposit 7 on the inside surface 6a of the dielectric member 6 from becoming generally continuous (such as shown in FIG. 2A) during processing of a substrate in the process chamber 5 containing a plasma of the processing gas.

Figure 3:
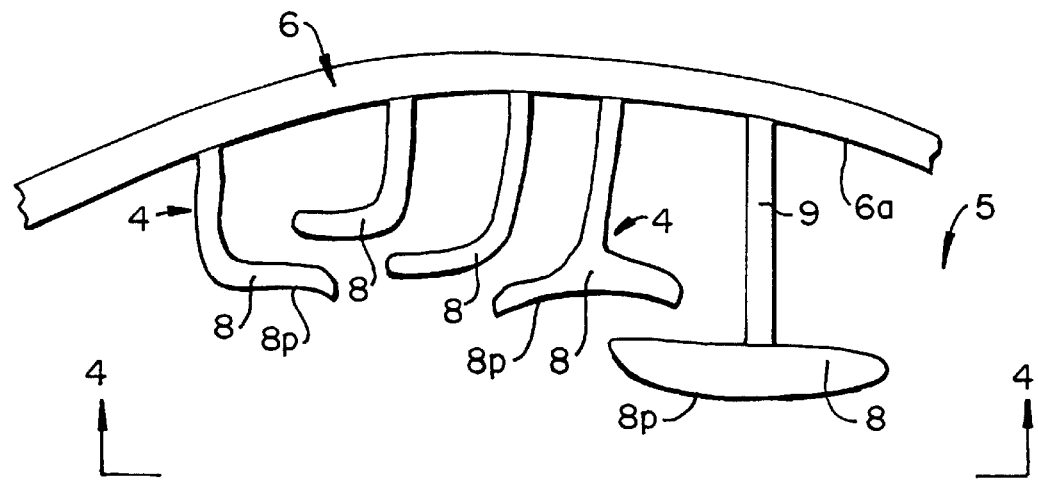
FIG. 3 is a side elevational view of another embodiment of a plurality of the assemblies for allowing stable power transmission into a plasma processing chamber, with the assemblies being coupled or secured to an inside surface of a dome-shaped dielectric member.
Figure 4:
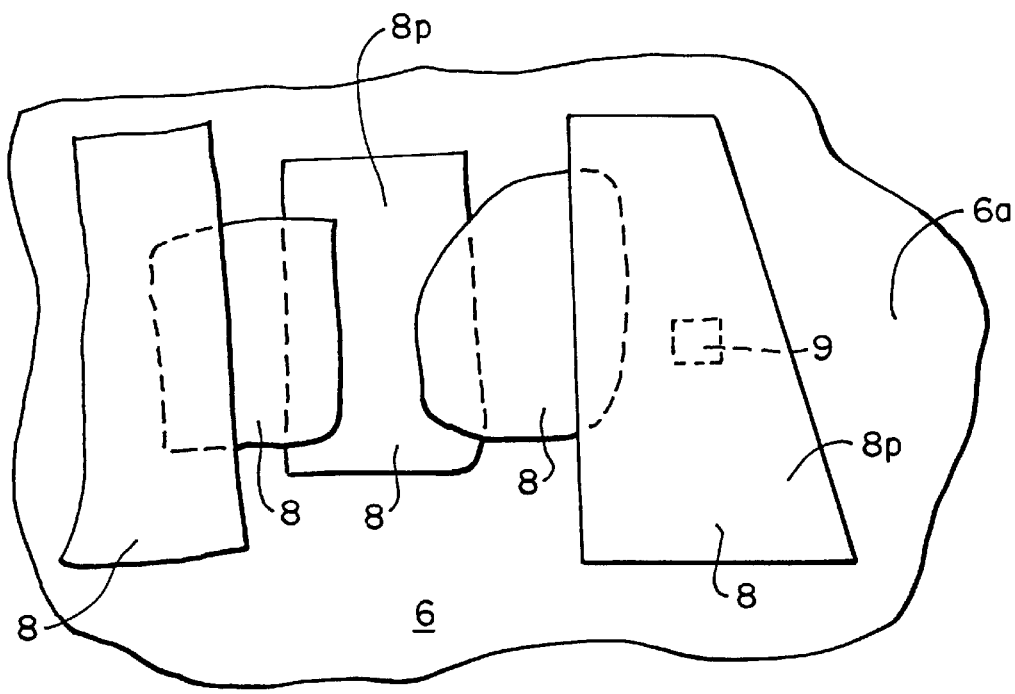
FIG. 4 is a horizontal view taken in direction of the arrows and along the plane of line 4—4 in FIG. 3.

The assembly 4 of the present invention includes any such assembly or apparatus or member which is capable of functioning for the purpose of assembly 4. In one embodiment of the invention, the assembly 4 includes a plurality of deposition support members 8 supported in an overlapping and spaced relationship with respect to each other by stanchion or brace members 9, as shown in FIGS. 1 and 2. The deposition support members 8 have an inner face 8f (see FIGS. 1, 2, 3, and 5). A respective brace member 9 secures to a respective deposition support inner face 8f (see FIGS. 1–3 and 5) of a respective member 8 and to the inside surface 6a of the dielectric member 6 to posture the respective deposition support member 8 in a spaced relationship with respect to the dielectric member 6. The respective brace members 9 may be secured to the inside surface 6a of the dielectric member 6 and to the respective deposition support members 8 by any suitable means, such as with a high temperature adhesive glue sold by Devcon Corporation, Wood Dale, Ill., 60191 under the trademark Devcon®. As best shown in FIG. 1, the brace members 9 may typically vary in length such that contiguous deposition support members 8—8 overlap and are spaced from each other. As also best shown in FIG. 1, the assembly 4 of the present invention may include a pair of interconnected brace-deposition support member assemblies such as brace member 9a/deposition support member 8a assembly interconnecting to and supporting brace member 9b/deposition support member 8b assembly off of the inside surface 9a of the dielectric member 9. In such an arrangement, brace member 9a connects to the inside surface 6a of the dielectric member 6 and to deposition support member 8a, and brace member 9b mounts to deposition support member 8a and attachedly supports deposition support member 8b. Thus, brace member 9b separates deposition support member 8a from deposition support member 8b. With deposition support members 8a and 8b being in such a spaced position, deposition support member 8c may conveniently extend into the space between deposition support members 8a and 8b as shown in FIG. 1. In another embodiment of the invention, and as best shown in FIG. 3, the assembly 4 consist of deposition support members 8 directly secured or coupled to (or integrally formed with) the inside surface 6a of the dielectric member 6. In this embodiment of the invention, a portion of the structure of the deposition support members 8 functions as a brace member 9. Some of the deposition support members 8 in FIG. 3 are hood shaped with the brace member 9 not securing to any inner face 8f but integrally connecting to an edge of the respective support member 8.

Figure 14A:
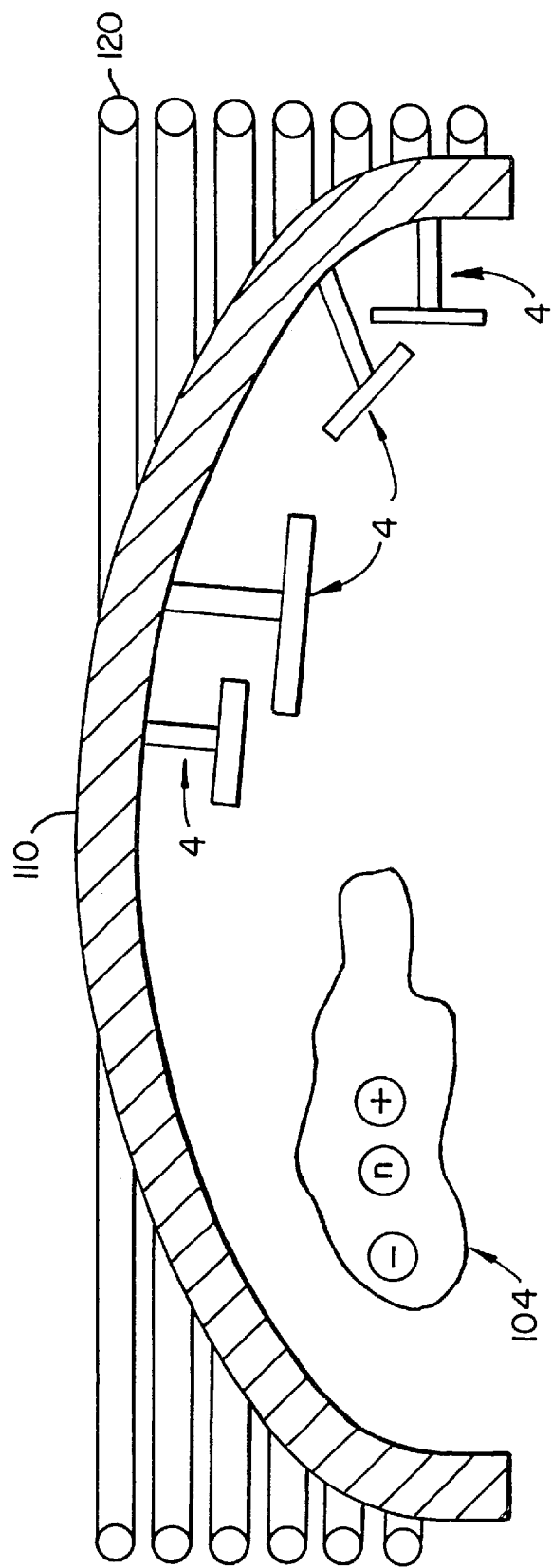
FIG. 14A is a vertical sectional view of the dome-shaped dielectric ceiling of the inductively coupled RF plasma reactor of FIG. 12 with a plurality of the assemblies of the present invention attached to the inside surface of the dome-shaped dielectric ceiling for receiving and supporting a deposit of materials and for allowing stable power transmission to pass through the dome-shaped dielectric ceiling and into a plasma processing chamber of the inductively coupled RF plasma reactor.
Figure 14B:
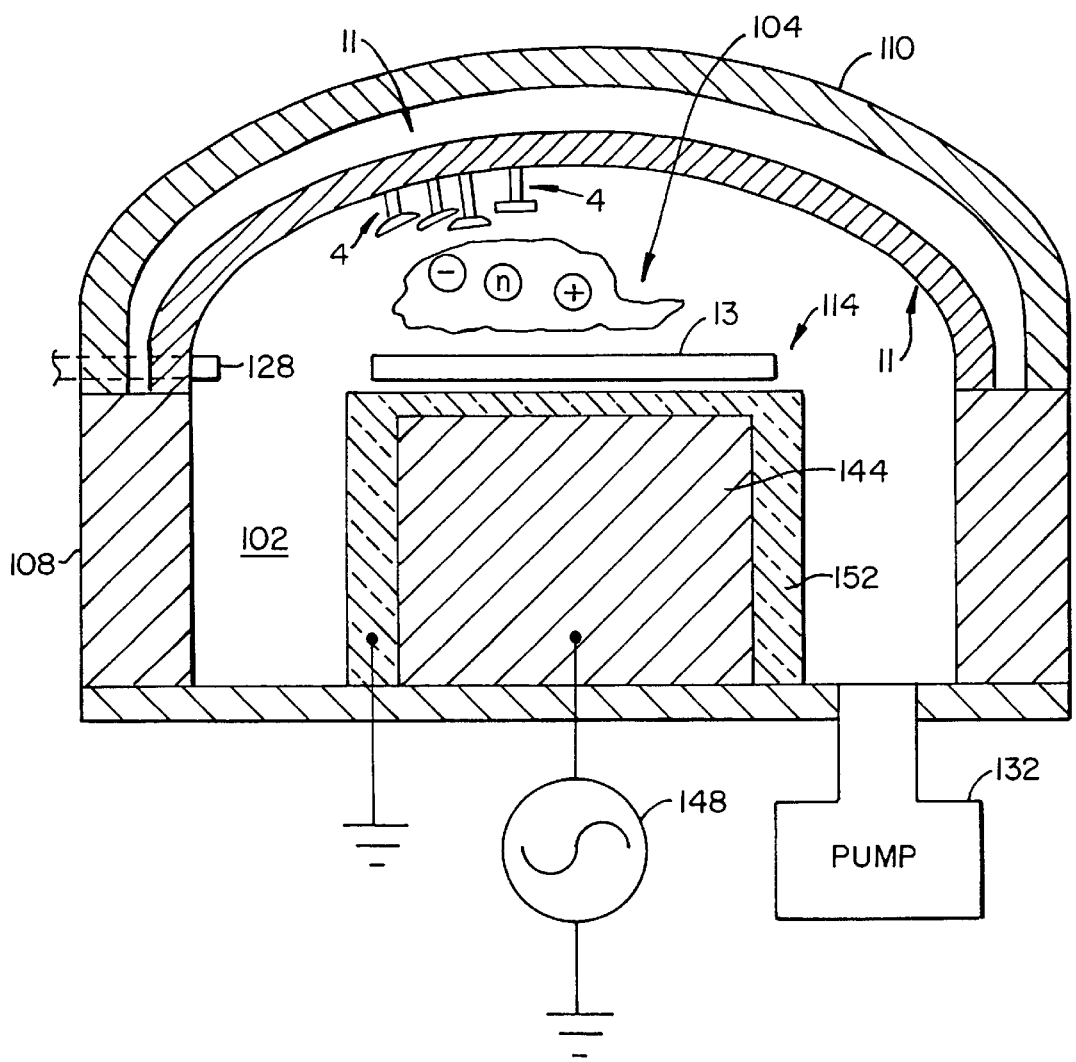
FIG. 14B is a partial vertical sectional view of a plasma reactor having a dome-shaped dielectric ceiling and a perforated liner assembly, both supported by a chamber wall of the plasma reactor and having a plurality of the assemblies of the present invention attached to the inside surface of the perforated liner assembly for receiving and supporting a deposit of materials and for allowing stable power transmission to pass through the dome-shaped dielectric ceiling, through the perforated liner assembly, and into a plasma processing chamber of the plasma reactor.

In another embodiment of the present invention and as best shown in FIG. 14B, the assembly 4 of the present invention is connected to a liner assembly, generally illustrated as 11, which is supported by a conductive side wall (identified as "108" below) of a reactor chamber (identified as "102" below). The brace members 9 connect to the liner assembly 11 in a similar fashion (e.g. with the high temperature adhesive glue) as the respective brace members 9 connect to the inside surface 6a of the dielectric member 6 and as the respective deposition support members 8 connect to the respective brace members 9. The liner assembly 11 is preferably a perforated network assembly, such as a screen or the like, that is capable of allowing processing power (e.g. energy waves from RF power or magnetron power or microwave power, etc.) to pass through it after passing through the dielectric member 6 (e.g. a dielectric ceiling identified as "110" below). The liner assembly 11 may be a lattice network assembly comprising a plurality of members disposed in a criss-cross fashion. The liner assembly 11 may possess any suitable geometric shape, such as dome-shaped (see FIG. 14B), arcuate shape, rectangular shape, generally planar-like shape, etc. The liner assembly 11 in FIG. 14B is a generally inverted colander-like structure with a plurality of the assemblies 4 connected thereto. The liner assembly 11 may be manufactured from any suitable material (e.g. a dielectric material, etc.) that is capable of allowing processing power to pass therethrough while withstanding the controlled environment to which it is subjected.

The liner assembly 11 and assembly 4 including the brace members 9 and the deposition support members 8 may be manufactured from any suitable material, such as metal, plastic, electrically non-conductive materials, etc. Preferably, the liner assembly 11 and brace members 9 comprise any substance or material that has an extremely low dielectric constant or low thermal conductivity, or both. The liner assembly 11 and brace members 9 are preferably essentially non-conductive and may consist of a wide variety of solid types of non-conductive material such as porcelains, glass, mica, magnesia, alumina, aluminum silicate, various high polymers (e.g. epoxies, polyethylene, polystyrene, PVC, phenolics, etc.) cullulosic materials, cellular rubber, nylon, and silicone resins. These low dielectric constant materials may be used alone or in combination with other insulators. The deposition support members 8 are preferably manufactured from a semiconductive material or an electrically conductive material. Suitable semiconductive materials include germanium, silicon, silicon carbide, and selenium, etc., with resistivities in the range of $10^{-2}$ to $10^9$ ohms/cm. Suitable electrically conductive materials include metals (e.g. aluminum, copper, platinum, etc.) and alloys, carbon and graphite, etc.

The brace members 9 and the deposition support members 8 may have any geometric shape. Suitable geometric shapes for the brace members 9 would include brace members 9 having a horizontal cross section representing a square or rectangular planar surface (see FIGS. 1 and 2); or a horizontal cross section representing a triangular or a circular or a trapezoidal planar surface. Suitable geometric shapes for the deposition support members 8 would include deposition support members 8 having a face 8p whose top plan view represents a square, a trapezoid, an irregular shape (see FIGS. 2, 4 and 6), as well as a triangle or any other shape that is capable of receiving and supporting the deposit 7. The faces 8p of the deposition support members 8 may also have any suitable shape in vertical cross-section or side elevational view, such as arcuate, concave, or convex (see FIG. 3), by way of example only. The thickness T (see FIG. 7) of the respective deposition support members 8 should be thicker than the "skin depth" of the deposit 7, such as by way of example only, a thickness greater than about 0.02 inch for the anticipated deposit (e.g. deposit of aluminum) when the process chamber 5 is operating at $\geq 100$ KHz RF frequency. The face 8p of the respective deposition support members 8 may have any suitable dimensions (e.g. breadth, length, etc.) and any suitable area which would depend on the area of the inside surface 6a of the dielectric member 6 to be spacedly covered with a plurality of the deposition support members 8, and the number of deposition support members 8 to be employed for being extended over the inside surface 6a of the dielectric member 6. The surface area of the face 8p of the respective deposition support members 8 would typically range from about 1 sq. cm. to about 100 sq. cms. The distance of the space or gap G between contiguous deposition support members 8 would depend on the geometry of the dielectric member 6, the number of deposition support members 8 employed, as well as the respective areas of the respective faces 8p of individual deposition support members 8. Typically, the distance of the gap G would range from about 0.05 cm to about 1.0 cm.

Figure 5:
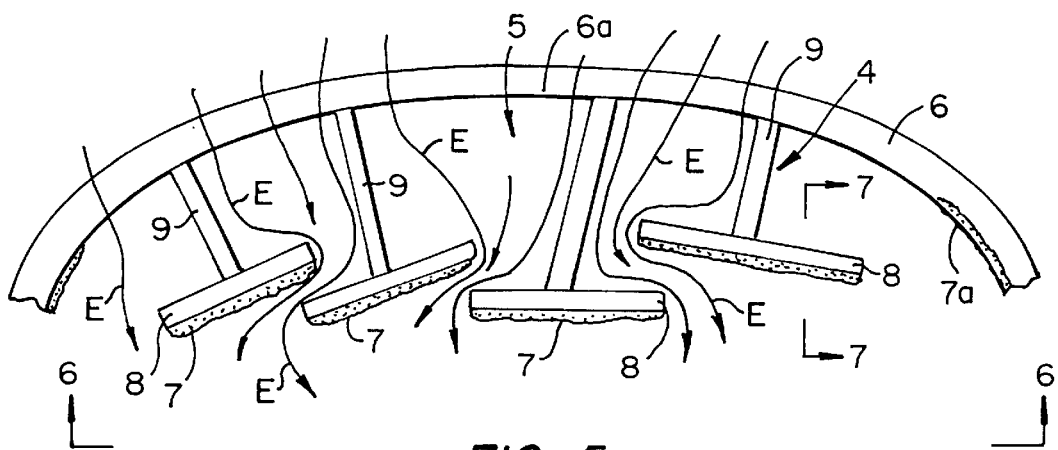
FIG. 5 is another embodiment of a plurality of the assemblies for allowing stable power transmission into a plasma processing chamber, with the assemblies being coupled or secured to an inside surface of a dome-shaped dielectric member, and with the deposition support members of the assemblies supporting a deposit of a material (e.g. electrically conductive by-products resulting from processing a semi-conductor wafer in the plasma processing chamber) and with part of the inside surface of the dielectric member also having the deposit of material.
Figure 6:
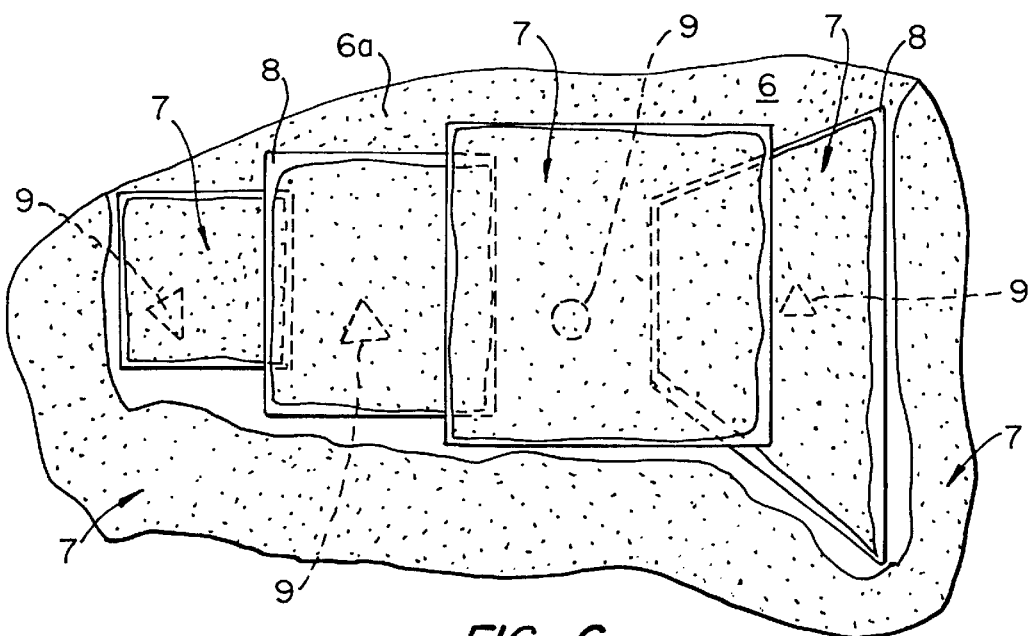
FIG. 6 is a horizontal view taken in direction of the arrows and along the plane of line 6—6 in FIG. 5, disclosing the deposit of material on the deposition support members of the assemblies in FIG. 5 and disclosing the deposit of material on the inside surface of the dielectric member which is not being shielded by any of the deposition support members.
Figure 7:
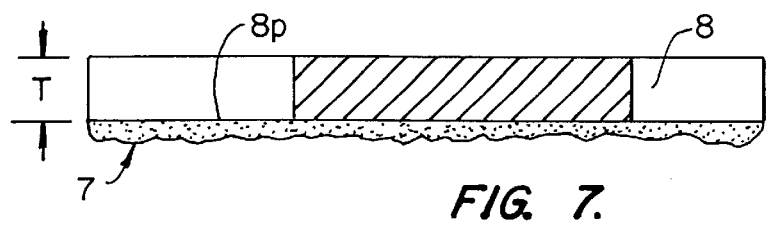
FIG. 7 is a vertical sectional view taken in direction of the arrows and along the plane of line 7—7 in FIG. 5.

The purpose of the deposition support members 8 is to receive and support deposit 7 of material that would deposit on the inside surface 6a of the dielectric member 6 if the deposition support members 8 were not available for receiving and supporting the deposit 7. During the processing of substrates in the process chamber 5 containing a plasma of the processing gas, it is believed that the waves of energy from the power transfer pass through the dielectric member 6 and then curve or bend around the respective deposition support members 8 as best shown by the arrows E in FIG. 5. Deposit 7 that is intended to be deposited on the inside surface 6a of the dielectric member 6 underneath the respective deposition support members 8 is received and supported by the respective deposition support members 8. Any inside surface 6a which is not spacedly covered by a deposition support member 8 receives deposit 7 as best shown in FIGS. 5 and 6. Thus, the deposition support members 8 of the present invention function as a plurality of discreet shields that protect the inside surface 6a of the dielectric member 6 from receiving electrically conductive by-products (i.e. the deposit 7 of materials), while allowing waves of energy from the processing power to be diverted and bent around (see arrows E in FIG. 5) the respective discreet deposition support members 8. This procedure allows and maintains a stable power transmission through the dielectric member 6 and retards a decline in the etch rate taking place on a substrate being processed within the process chamber 5 containing a plasma of a processing gas.

Figure 8:
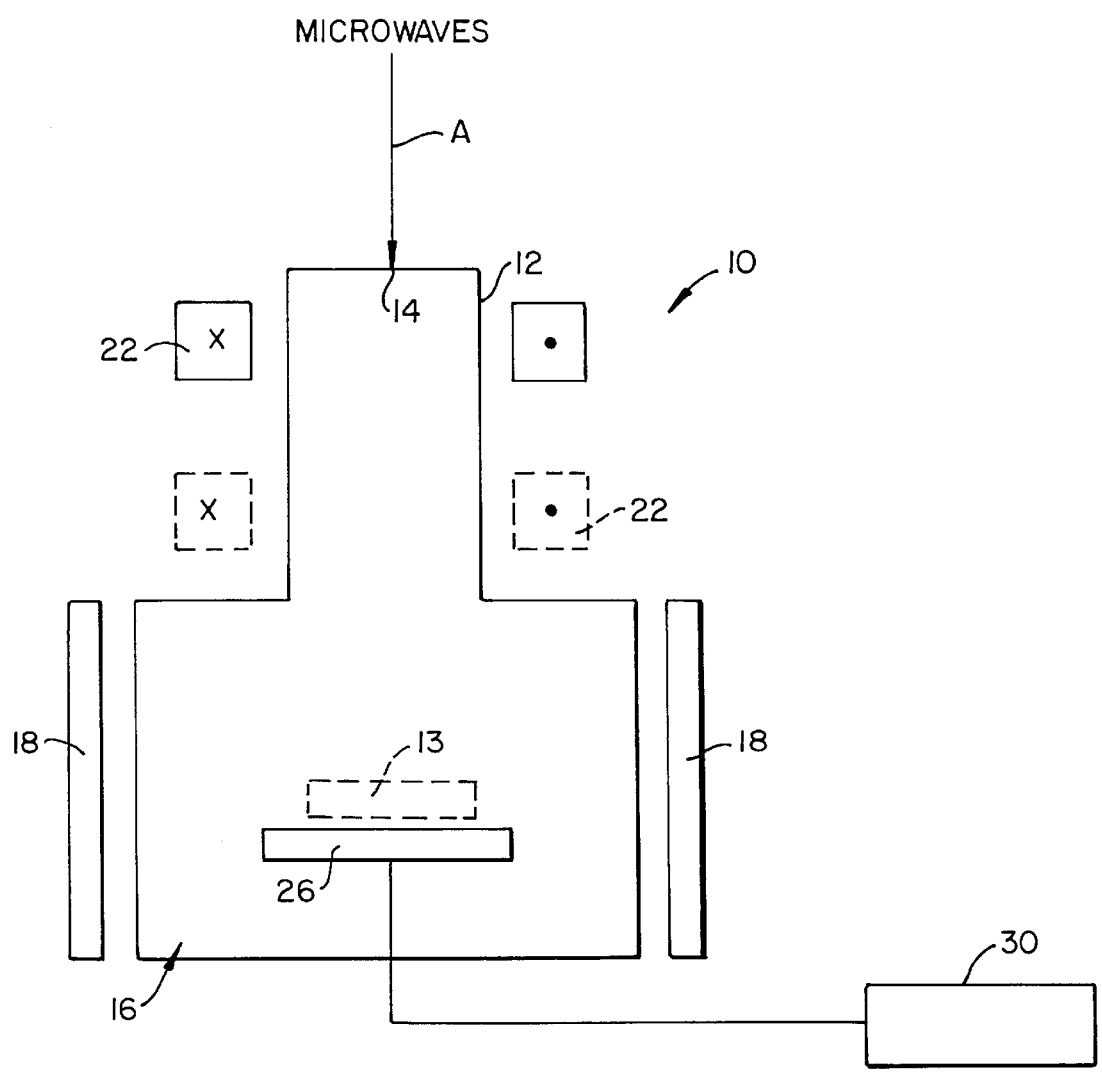
FIG. 8 is a schematic diagram of a prior art electron cyclotron resonance (ECR) source reactor.

The assembly 4 of the present invention may be used with any prior art plasma processing apparatus. In a preferred embodiment of the present invention, the assembly 4 is employed in prior art reactors schematically shown in FIGS. 8 through 11 and having the common features of a power transfer across dielectric windows and a separate bias supply at the wafer electrode. The prior art reactors in the schematic diagrams of FIGS. 8 through 11 differ significantly however in the means by which power is coupled to the plasma. For the electron cyclotron resonance (ECR) source depicted in FIG. 8, there is seen an ECR source reactor, generally illustrated as 10, having a cylindrical source chamber 12 with a dielectric window 14. The cylindrical source chamber 12 communicates with a process chamber 16 and at least one multidipole permanent magnet 18 surrounds the circumference of the process chamber 16 to increase radial plasma uniformity. The cylindrical source chamber 12 is surrounded by at least one electromagnet coil 22 to generate an axially varying dc magnetic field. A chuck or pedestal 26 is disposed in the process chamber 16 for supporting substrates including semiconductor wafers 13. The pedestal 26 is electrically connected to a bias RF source 30. Microwave power is injected axially in direction of the arrow A in FIG. 8, and through the dielectric window 14 into a processing gas (e.g. Ar, $N_2$, $Cl_2$, etc.) or source plasma within the cylindrical source chamber 12, where the microwave power excites a right-hand circularly polarized wave that propagates to a resonance zone where the wave is absorbed. The resulting plasma subsequently flows out of the cylindrical source chamber 12 into the process chamber 16 where the semiconductor wafer 13 is supported by the pedestal 26. ECR sources have been increasingly used for thin film deposition and etching due to their ability to deliver high-current densities (tens of $mA/cm^2$) at low ion energy (a few tens of eV). Because by-products resulting from processing substrates in the ECR source reactor 10 cause coating of the dielectric window 14, which could result in significant absorption of incident microwave power and a decrease in source efficiency, a plurality of the assemblies 4 of the present invention is connected to the dielectric window 14 in any suitable format, such as any of the formats as shown in FIGS. 1 or 3 or 5, in order for the deposition support members 8 to be in a position to receive and support by-product deposits and prevent the coating (e.g. the deposit 7) of the dielectric window 14.

Figure 9:
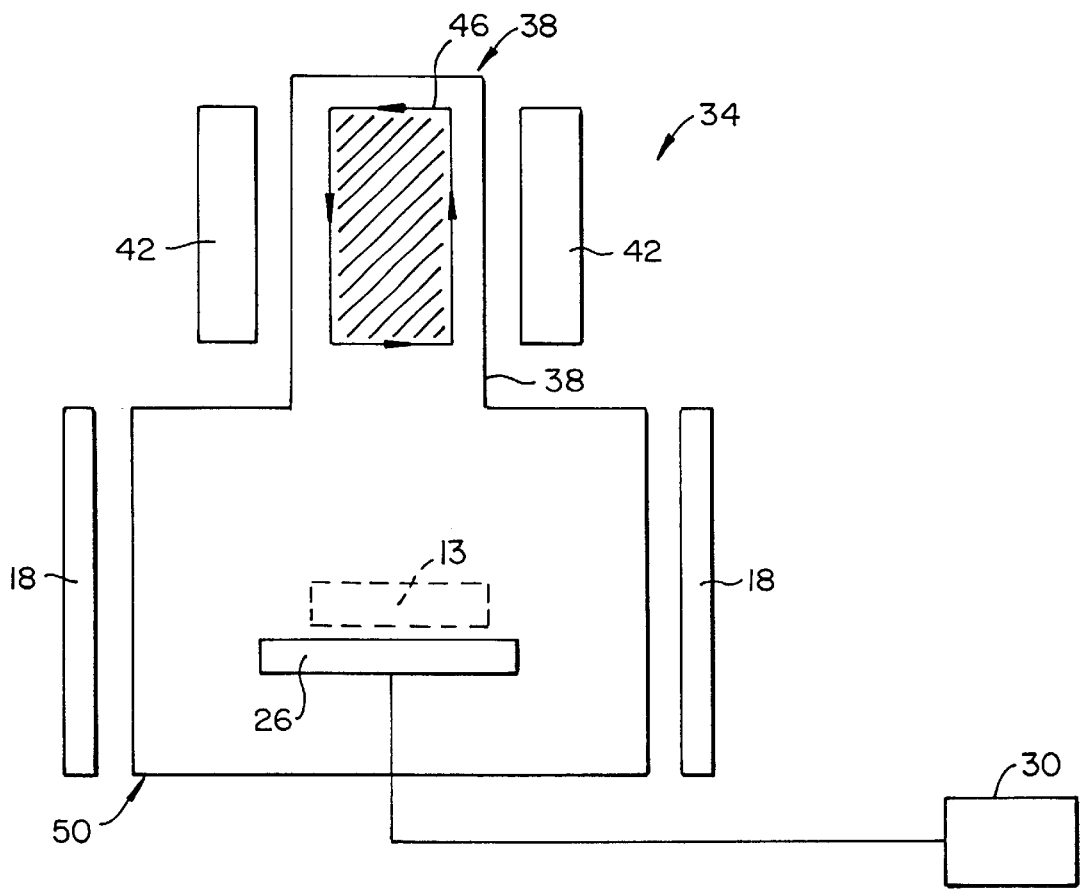
FIG. 9 is a schematic diagram of a prior art helicon source reactor.

Referring now to FIG. 9 for another prior art reactor which may employ the assembly 4 of the present invention and which transfers power across a dielectric window and has a separate bias supply at the wafer electrode, there is seen a helicon source reactor, generally illustrated as 34, having a dielectric cylinder, generally illustrated as 38. The dielectric cylinder 38 is surrounded by at least one electromagnet coil 42 and an RF antenna, generally illustrated as 46, is disposed in proximity to the dielectric cylinder 38. The dielectric cylinder 38 is manufactured from non-conductive or dielectric material and functions as a plasma chamber where plasma is generated. The plurality of the assemblies 4 of the present invention may be connected to the inside cylindrical surface of the dielectric cylinder 38 in any suitable format, such as any of the formats illustrated in FIGS. 1, 3 or 5. The dielectric cylinder 38 communicates with a process chamber, generally. illustrated as 50. At least one multidipole permanent magnet 18 surrounds the circumferential area of the process chamber 50 to increase radial plasma uniformity. Pedestal 26 is situated in the process chamber 50 for supporting substrates including semiconductor wafers 13, and is electrically connected to the bias RF source 30. A weak (e.g. 50–200 G) dc axial magnetic field emanating from the electromagnet coil 42 and passing through the dielectric cylinder 38, along with the rf-driven antenna 46 in proximity to the dielectric cylinder 38, allows execution of a helicon wave within a processing gas (e.g. Ar, $N_2$, $Cl_2$, etc.) contained in the dielectric cylinder 38. Resonant wave-particle (Landau damping) is believed to transfer helicon wave energy into the processing gas to produce the plasma which subsequently flows out of the dielectric cylinder 38 into the process chamber 50 where the semiconductor wafer 13 is supported by the pedestal 26. As was previously indicated, the effect of the multidipole magnet 18, which surrounds the process chamber 50 is to increase radial plasma uniformity. Because by-products resulting from processing substrates in the helicon source reactor 34 cause deposits on the inside surfaces of the dielectric cylinder 38, the assemblies 4 are disposed on the inside cylindrical surface of the dielectric cylinder 38 to position the deposition support members 8 for receiving and supporting by-product deposits (e.g. deposit 7 of materials) to keep the inside cylindrical surface of the dielectric cylinder 38 free of electrical conductive by-products.

Figure 10:
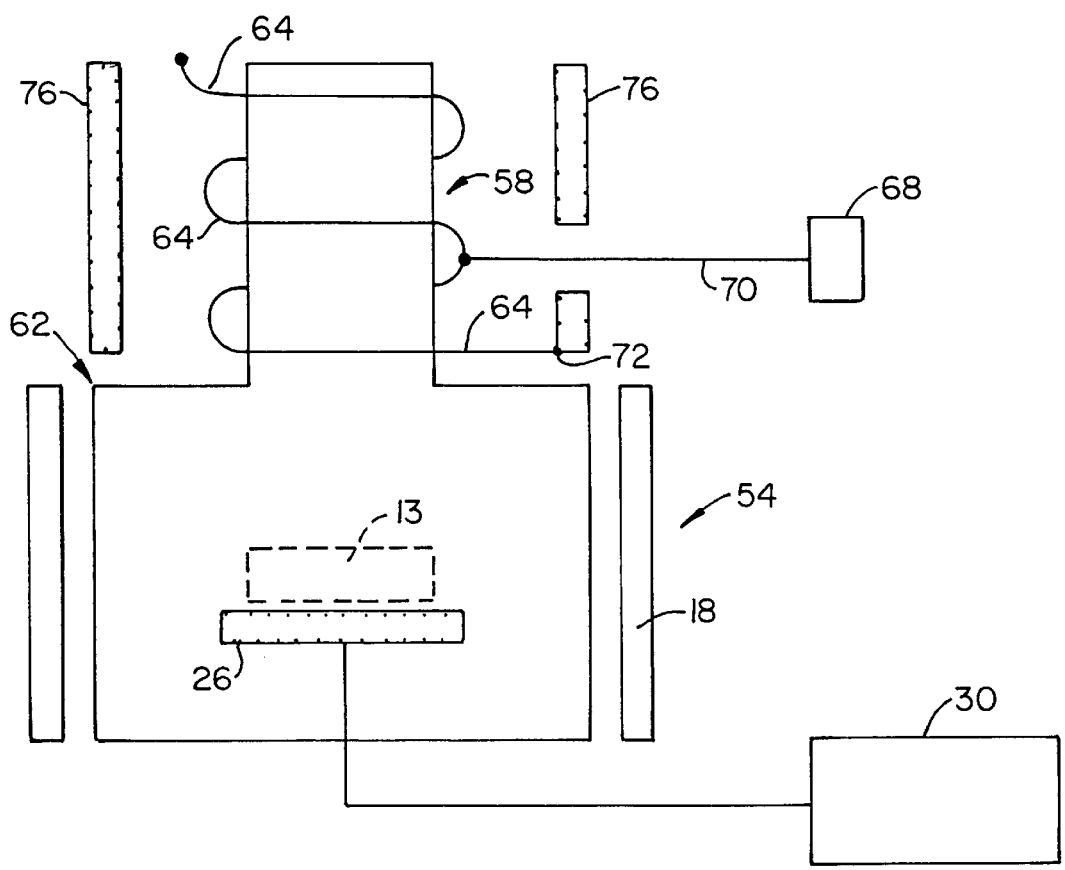
FIG. 10 is a schematic diagram of a prior art helical resonator reactor.

Another prior art reactor employing a dielectric window wherethrough processing power is transferred along with possessing a separate bias supply at the wafer electrode, is a helical resonator reactor, generally illustrated as 54 in FIG. 10. The helical resonator reactor 54 may also employ a plurality of the assemblies 4 of the present invention. The helical resonator reactor 54 includes a dielectric discharge chamber 58 supported by and communicating with a process chamber 62. The dielectric discharge chamber 58 is helically surrounded by a helix 64 which is coupled to an RF power source 68 via conductor 70 and is grounded at 72 to a cylindrical conducting shield 76 which is preferably manufactured from copper. The helix 64 is generally concentrically disposed around the dielectric discharge chamber 58. The process chamber 62 is surrounded by one or more multidipole permanent magnets 18 in order to increase radial plasma uniformity. Pedestal 26 is disposed in the process chamber 62 for supporting substrates (e.g. semiconductor wafers 13) and is electrically coupled to the bias RF source 30. The helical resonator reactor 54 has a high characteristic impedance and operates at radio frequencies ranging from about 3 MHz to about 30 MHz and exhibits high Q, typically ranging from about 600 to about 1500. The helix 64 and the cylindrical conducting shield 76 coaxially surrounding the dielectric discharge chamber 58 form a slow wave structure; i.e., supporting an electromagnetic wave propagation along the z-axis with a phase velocity much less than the velocity of light. The composite slow wave structure becomes resonant by excitation of a resonant axial mode occurring when an integral number of quarter waves of the rf field fit between opposed ends of the dielectric discharge chamber 58. When this condition occurs, the intense electromagnetic fields within the helix 64 efficiently couples the rf power to the plasma and sustains the plasma with negligible matching loss at low gas pressure. In order to have efficiently coupling of the rf power through the dielectric discharge chamber 58 to the plasma, the inside surface of the dielectric discharge chamber 50 must be free of electrical conductive by-products such as metal oxides and the like. A plurality of the assemblies 4 are coupled to the inside surface of the dielectric discharge chamber 58 in any suitable format, such as any of the formats of FIGS. 1, 3 or 5, to posture the deposition support members 8 to receive and support electrical conductive by-products (e.g. the deposit 7 of materials) and to prevent a build-up of such electrical conductive by-products on the inside surface(s) of the dielectric discharge chamber 58.

Figure 11:
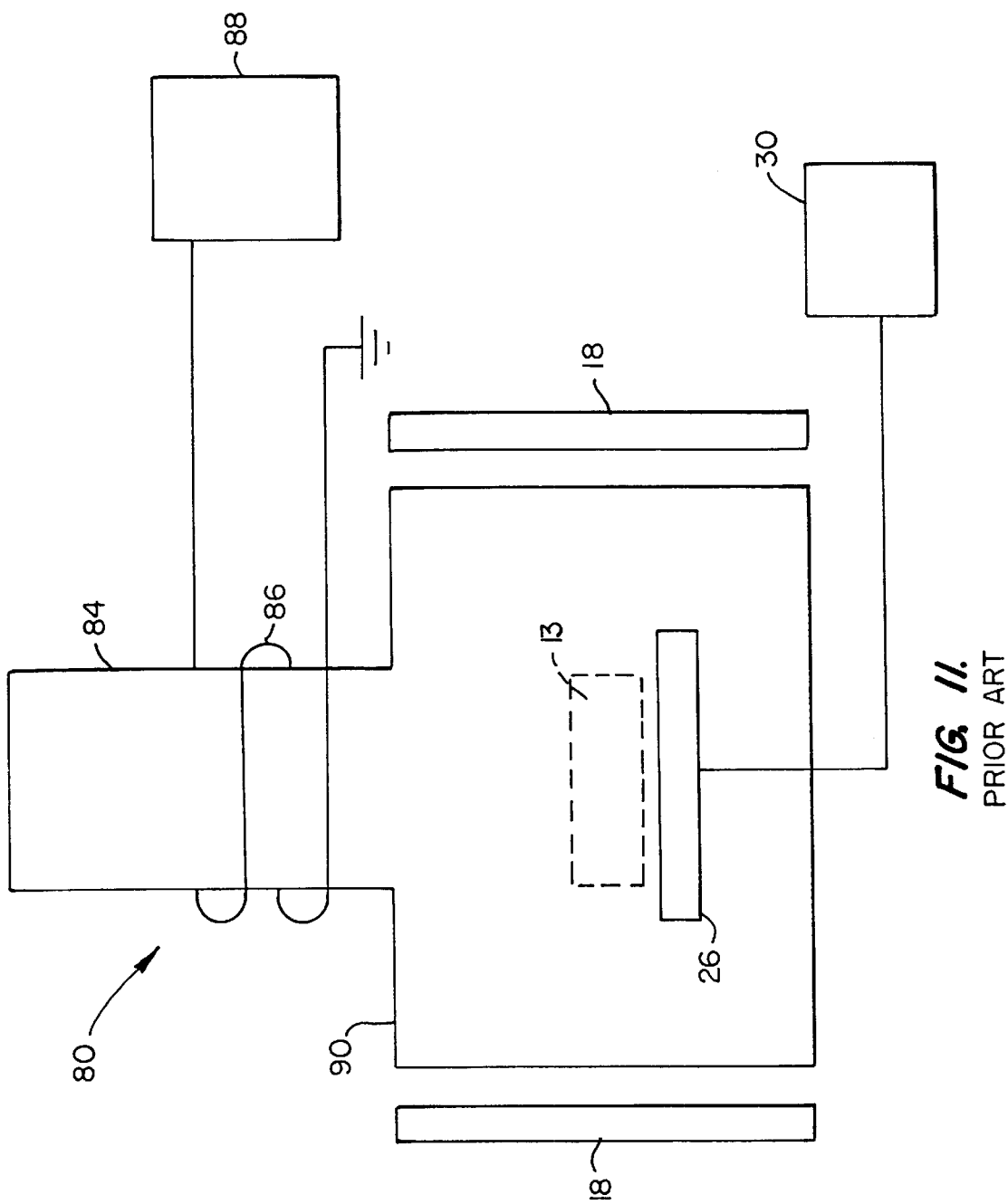
FIG. 11 is a schematic diagram of a prior art inductively coupled plasma reactor.

Referring now to FIG. 11 for a schematic diagram of still another prior art reactor which may employ the assemblies 4 of the present invention and has the features of a power transfer across a dielectric window and a separate bias supply at the wafer electrode, there is seen an inductively coupled plasma reactor, generally illustrated as 80. The inductively coupled plasma reactor 80 comprises a dielectric discharge chamber 84 that is circumferentially surrounded by a multiturn, non-resonant cylindrical rf coil 86 (i.e. helical rf inductive coil 86) that is coupled to an RF power source 88. A plurality of the assemblies 4 is coupled to an inside cylindrical surface of the dielectric discharge chamber 84 to receive and support electrically conductive by-products (e.g. the deposit 7 of materials) off of the inside cylindrical surface of the dielectric discharge chamber 84. The dielectric discharge chamber 84 communicates with a process chamber 90 which is surrounded by one or more multidipole permanent magnets 18 to increase radial plasma uniformity. As was seen for the prior art reactors of FIGS. 8–10, pedestal 26 is disposed in the process chamber 90 for supporting substrates including semiconductor wafers 13. Pedestal 26 is electrically coupled to bias RF source 30.

Inductively coupled plasma reactors, such as reactor 80 in FIG. 11, are currently used to perform various processes on semiconductor wafers including metal etching, dielectric etching, chemical vapor deposition, and physical vapor deposition, as some examples. In an etch process, one advantage of an inductively coupled plasma is that a high density plasma ion density is provided to permit a large etch rate with a minimal plasma D.C. bias, thereby permitting more control of the plasma D.C. bias to reduce device damage. For this purpose, the source power applied to the inductive coil and the D.C. bias power applied to the wafer pedestal are separately controlled RF supplies. Separating the bias and source power supplies facilitates independent control of ion density and ion energy, in accordance with well-known techniques. Plasma in an inductive source is created by application of rf power to a non-resonant inductive coil, such as helical coil 86 in FIG. 11, or a planar coil (not shown) for a close-coupled or planar source geometry as shown and described on pages 52–53 of an article entitled "Design of High-Density Plasma Sources" by Lieberman et al from Volume 18 of "Physics of Thin Films", copyright 1994 by Academic Press Inc. of San Diego, Calif. The application of rf power to a non-resonant inductive coil results in the breakdown of the process gas within a dielectric discharge chamber, such as the dielectric discharge chamber 84 in FIG. 11, by the induced rf electric field which passes through the dielectric discharge chamber. Therefore, the coil inductor provides RF power which ignites and sustains the plasma of the processing gas.

Figure 12:
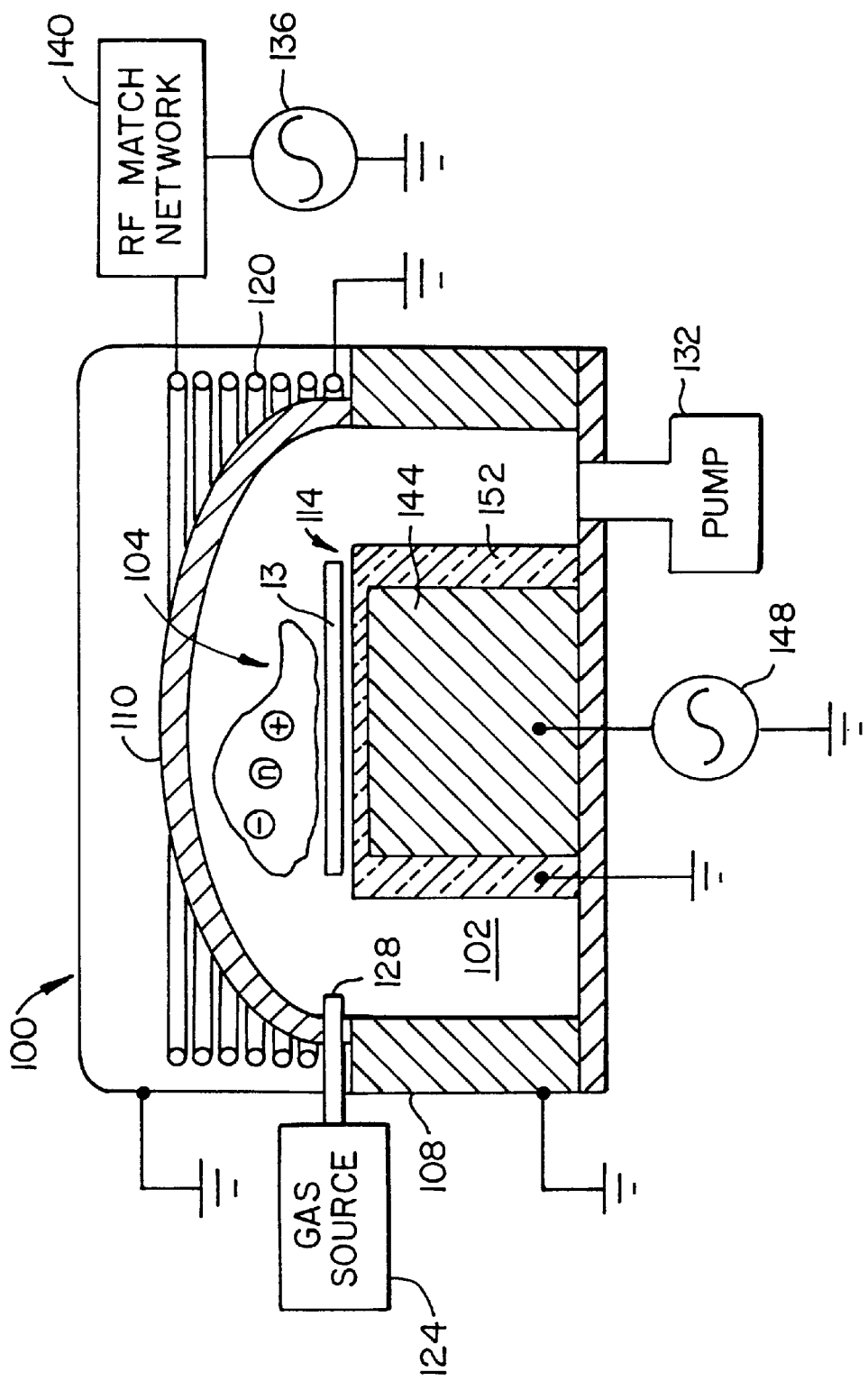
FIG. 12 is a simplified cut-away view of an inductively coupled RF plasma reactor having a dome-shaped dielectric ceiling which may support a plurality of the assemblies of the present invention for allowing stable power transmission to pass through the dome-shaped ceiling and into the plasma processing chamber.
Figure 13:
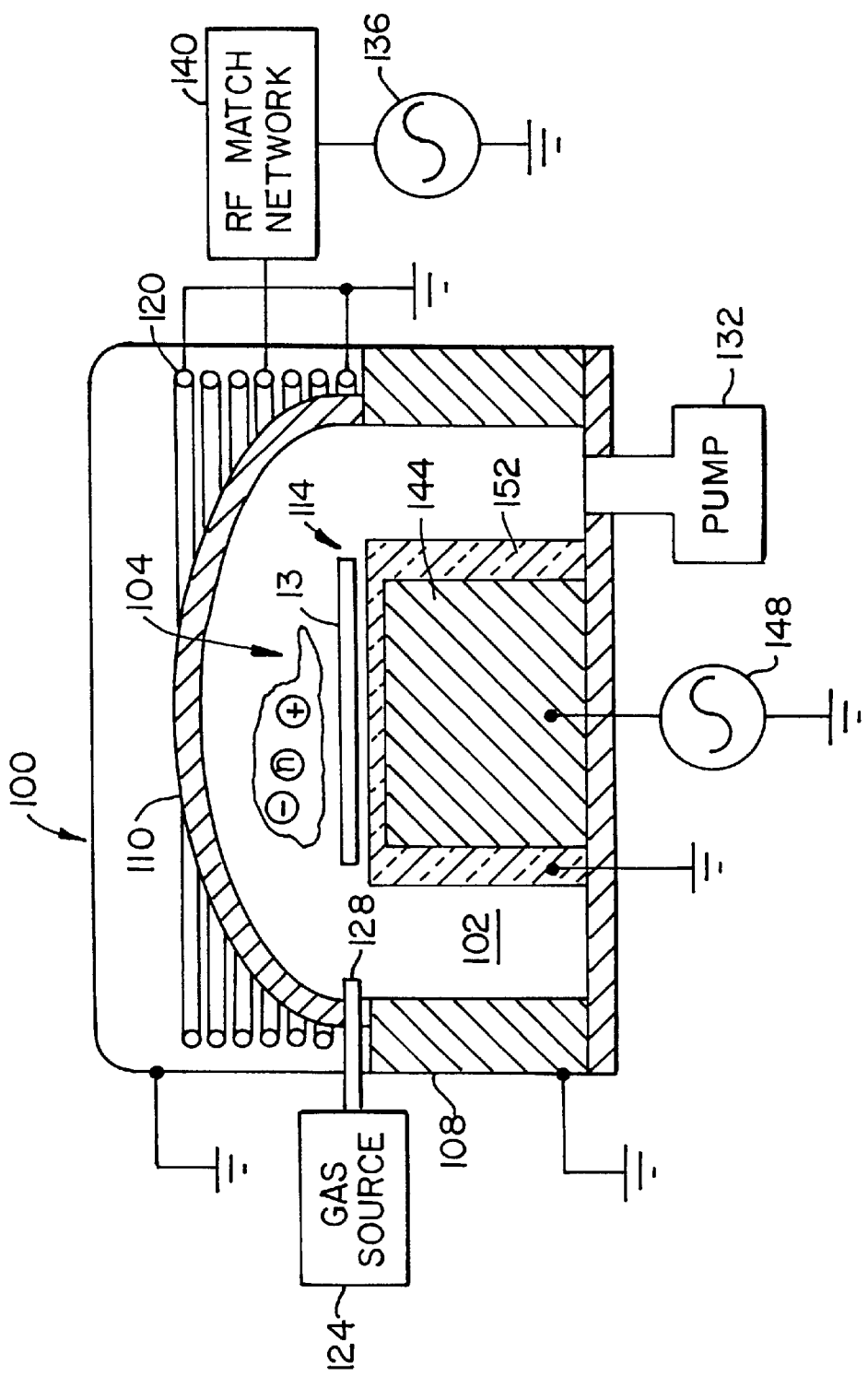
FIG. 13 is a simplified cut-away view of another inductively coupled RF plasma with a dome-shaped dielectric ceiling whose inside surface may dependently support a plurality of the assemblies of the present invention for allowing stable power transmission to pass through the dome-shaped ceiling and into the plasma processing chamber.

A preferred inductively coupled plasma reactor for employing a plurality of the assemblies 4 of the present invention is that which inductively couples a plasma in a decoupled plasma source etch chamber sold under the trademark DPS™ owned by Applied Materials, Inc., 3050 Bowers Avenue, Santa Clara, Calif. 95054-3299. The DPS™ brand etch chambers decouples or separates the ion flux to the semiconductor wafer 13 from the ion acceleration energy and may be any of the DPS™ brand etch chambers of the inductively coupled plasma reactors disclosed in U.S. Pat. No. 5,753,044 entitled "RF PLASMA REACTOR WITH HYBRID CONDUCTOR AND MULTI-RADIUS DOME CEILING" and assigned to the present assignee and fully incorporated herein by reference thereto as if repeated verbatim immediately hereinafter. Referring now to FIGS. 12 and 13 for two (2) embodiments of an inductively coupled plasma reactor from co-pending U.S. Pat. No. 5,753,044, there is seen an inductively coupled RF plasma reactor, generally illustrated as 100, having a reactor chamber, generally illustrated as 102, wherein a high density plasma 104 of neutral (n) particles, positive (+) particles, and negative (−) particles are found. The reactor chamber 102 has a grounded conductive cylindrical sidewall 108 and a dielectric ceiling or window 110. A plurality of the assemblies 4 of the present invention may be secured to an inside surface of the dielectric ceiling 110 as best shown in FIG. 14. The inductively coupled RF plasma reactor 100 further comprises a wafer pedestal 114 for supporting the (semiconductor) wafer 13 in the center of the chamber 102, a cylindrical inductor coil 120 surrounding an upper portion of the chamber 102 beginning near the plane of the top of the wafer 13 or wafer pedestal 114 and extending upwardly therefrom toward the top of the chamber 102, an etching gas source 124 and gas inlet 128 for furnishing an etching gas into the interior of the chamber 102, and a pump 132 for controlling the pressure in the chamber 102. The coil inductor 120 is energized by a plasma source power supply or RF generator 136 through a conventional active RF match network 140, the top winding of the coil inductor 120 being "hot" and the bottom winding being grounded. The wafer pedestal 114 includes an interior conductive portion 144 connected to the bias RF power supply or generator 148 and an exterior grounded conductor 152 (insulated from the interior conductive portion 144). Thus, the plasma source power applied to the coil inductor 120 by the RF generator 136 and the DC bias RF power applied to the wafer pedestal 114 by generator 148 are separately controlled RF supplies. Separating the bias and source power supplies facilitates independent control of ion density and ion energy, in accordance with well-known techniques. To produce high density plasma 104 as an inductively coupled plasma, the coil inductor 120 is adjacent to the chamber 102 and is connected to the RF source power supply or the RF generator 136. The coil inductor 120 provides the RF power through the dielectric ceiling or window 110 which ignites and sustains the high ion density of the high density plasma 104. The geometry of the coil inductor 120 can in large part determine spatial distribution of the plasma ion density of the high density plasma 104 within the reactor chamber 102. The assemblies 4 allow stable power transmission to pass through the dielectric ceiling 110 and into the chamber 102 since the assemblies 4 would receive the deposit 7 of material and keep the inside surface of the dielectric ceiling 110 free of the electrically conductive deposit 7. The assemblies 4 would also prevent the deposit 7 of materials from becoming generally continuous during processing (e.g. metal etching) of the semiconductor wafer 13 in the high density plasma 104.

Uniformity of the plasma density spatial distribution of the high density plasma 104 across the wafer 13 is improved (relative to conical or hemispherical ceilings) by shaping the ceiling 110 in a multi-radius dome and individually determining or adjusting each one of the multiple radii of the ceiling 110. The multiple-radius dome shape in the particular embodiment of FIG. 12 somewhat flattens the curvature of the ceiling 110 around the center portion of the ceiling 110, the peripheral portion of the ceiling 110 having a steeper curvature.

As illustrated in FIG. 13 the coil inductor 120 may be coupled to the RF power source 136, 140 in a mirror coil configuration that is known to those skilled in the art. In the mirror coil configuration of FIG. 13, the RF source 136, 140 is connected to the center winding of the coil inductor 120 while the top and bottom ends of the coil inductor 120 are both grounded. The mirror coil configuration has the advantage of reducing the maximum potential on the coil inductor 120.

Figure 15:
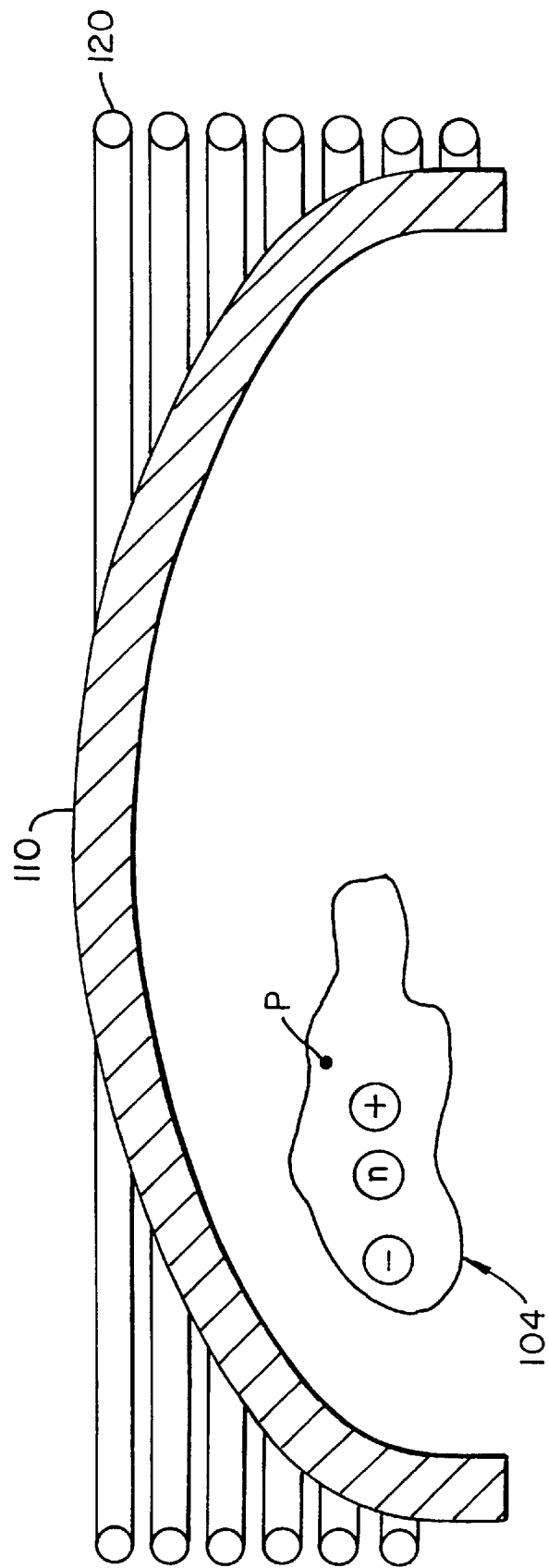
FIG. 15 is a vertical sectional view of a dome-shaped dielectric ceiling of the inductively coupled RF plasma reactor of FIG. 12 containing a high density plasma whose density is to be adjusted at a point P.
Figure 16:
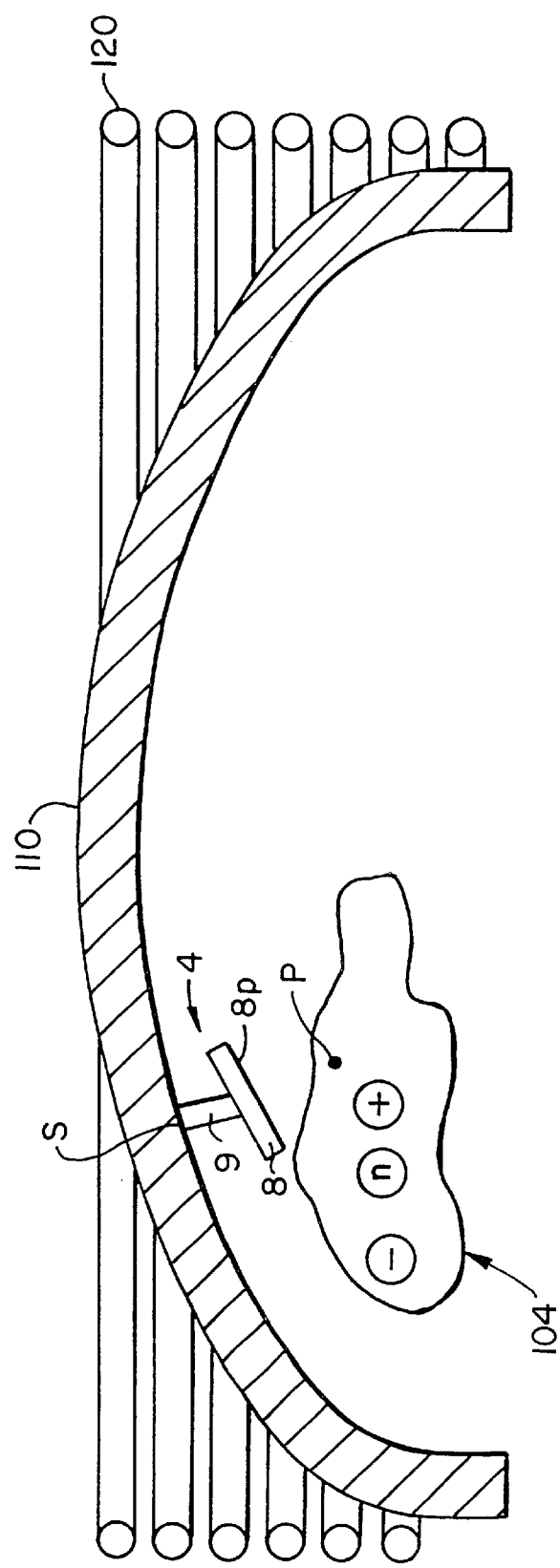
FIG. 16 is a vertical sectional view of a dome-shaped dielectric member of FIG. 15 with an assembly of the present invention secured to a certain situs on the inside surface of the dome-shaped dielectric member such that the density of the high density plasma may be adjusted at and/or in close proximity to the point P within the high density plasma.

In another embodiment of the present invention there is provided a method for adjusting the density of plasma contained in a chamber (e.g. reactor chamber 102 in FIGS. 12–13) wherein substrates (e.g. semiconductor wafers 13) are to be processed. In one preferred embodiment of this method and referencing FIGS. 15 and 16, after it has been determined that the density of the high density plasma 104 should be adjusted at a location within the reactor chamber 102 in proximity to a spot S (see FIG. 16) on the inside surface of the dielectric ceiling 110, such as at a point P within the high density plasma 104 (see FIGS. 15 and 16), processing power to the coil conductor 120 from the RF generator 136 (i.e. the plasma source power supply) through the conventional active RF match network 140 is interrupted (i.e. it is shut-off). The dielectric ceiling 110 is removed from engagement with the conductive sidewall 108. Subsequently and as best shown in FIG. 16, an assembly 4, including brace 9 deposition support member 8, is secured to the spot S on the inside surface of the dielectric ceiling 110. The dielectric ceiling 110 is reconnected to the conductive sidewall 108, and when processing power from the coil conductor 120 is reintroduced through the dielectric ceiling 110 and into the reactor chamber 102, the density of the high density plasma 104 at and/or in proximity to point P is adjusted. Typically and depending on the composition (e.g. electrically conductive vs. semiconductive, etc.) of the deposition support member 8 and the area of the planar face 8p of the deposition support member 8, the density of the high density plasma 104 at and/or in proximity to point P would be decreased. While this embodiment of the present invention has been described employing an inductively coupled RF plasma reactor, i.e. inductively coupled RF plasma reactor 100 of FIGS. 12 and 13, it is to be understood that the spirit and scope of the present invention includes the use of the assembly 4 on dielectric members of other prior art plasma processing apparatuses (e.g. ECR source reactors, helicon source reactors, helical resonator reactors, etc.) employing other types of processing power (e.g. magnetron power, microwave power, etc.). It is also to be understood that while this embodiment of the present invention has been described by employing a single assembly 4 (see FIG. 16) for adjusting the density of plasma, the spirit and scope of the present invention would include the employment of a plurality of assemblies 4 for adjusting the density of plasma. The plurality of the assemblies 4 would include respective deposition support members 8 disposed in an overlapping and spaced relationship with respect to each other. The assembly or assemblies 4 would receive and support a deposition of materials (e.g. the deposit 7 of materials) during processing (e.g. metal etching) of at least one semiconductor wafer 13 in a reactor chamber, such as reactor chamber 102 in FIGS. 12 and 13.

Figure 17:
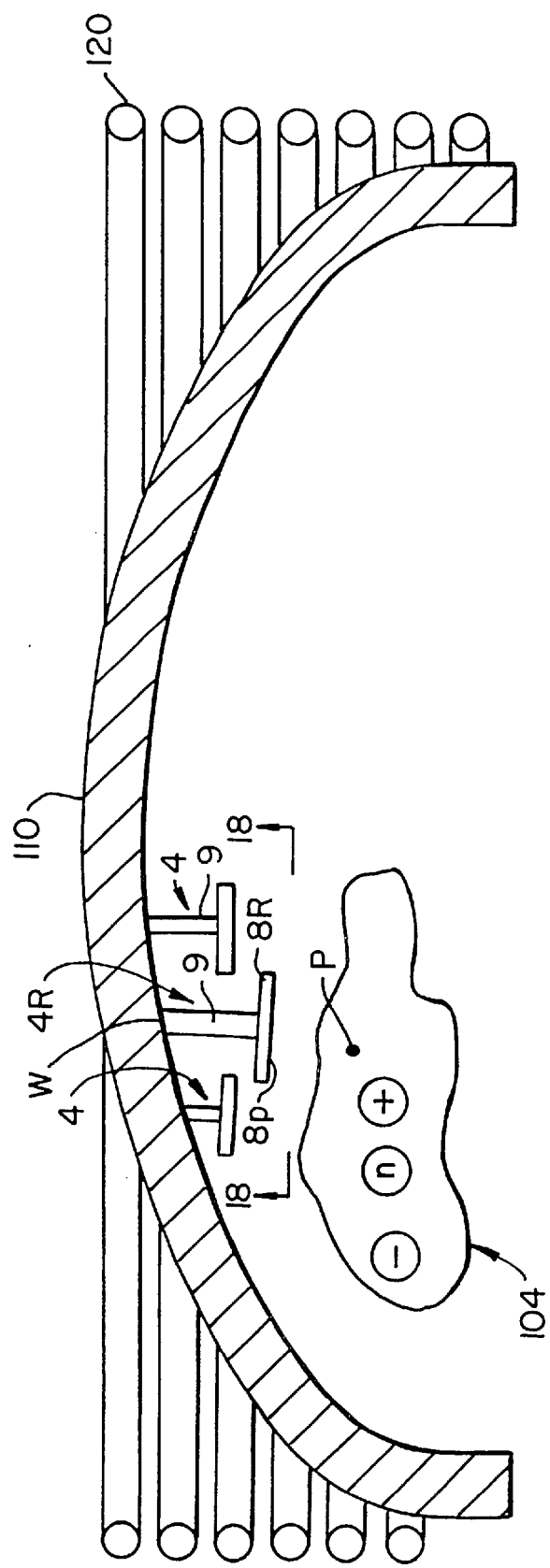
FIG. 17 is a vertical sectional view of the dome-shaped dielectric ceiling of the inductively coupled RF plasma reactor of FIG. 12, with the inside surface having dependently coupled thereto a plurality of the assemblies of the present invention for allowing a stable power transmission to pass through the dome-shaped dielectric ceiling and into the process chamber, and containing a plasma whose density is to be adjusted at and/or in proximity to a point P within the plasma.
Figure 18:
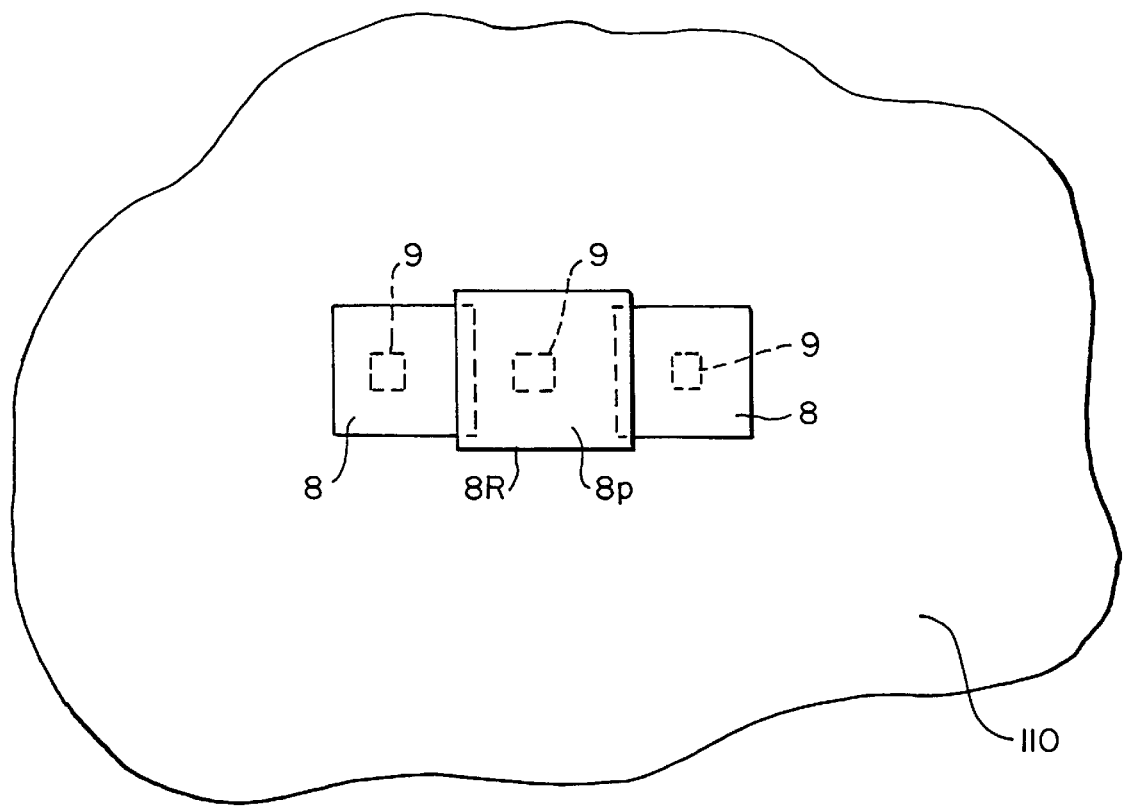
FIG. 18 is a horizontal view taken in direction of the arrows and along the plane of line 18—18 in FIG. 17.
Figure 19:
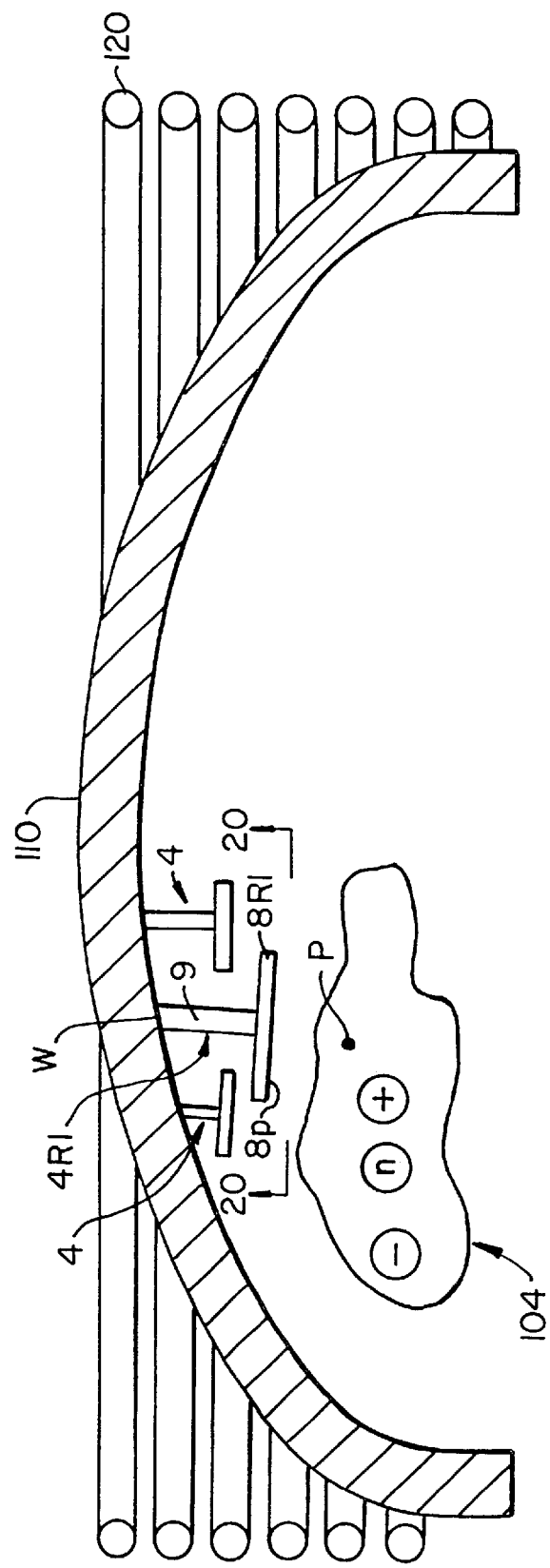
FIG. 19 is a vertical sectional view of a dome-shaped dielectric ceiling of FIG. 12 after one of the assemblies including a deposition support member has been removed from the inside surface of the dome-shaped dielectric ceiling and replaced with another assembly having a deposition support member with a planar surface area that is larger or greater than a planar surface area of the deposition support member from the assembly which was removed, in order to lower the density of the plasma at and/or in proximity to the point P in the plasma.
Figure 20:
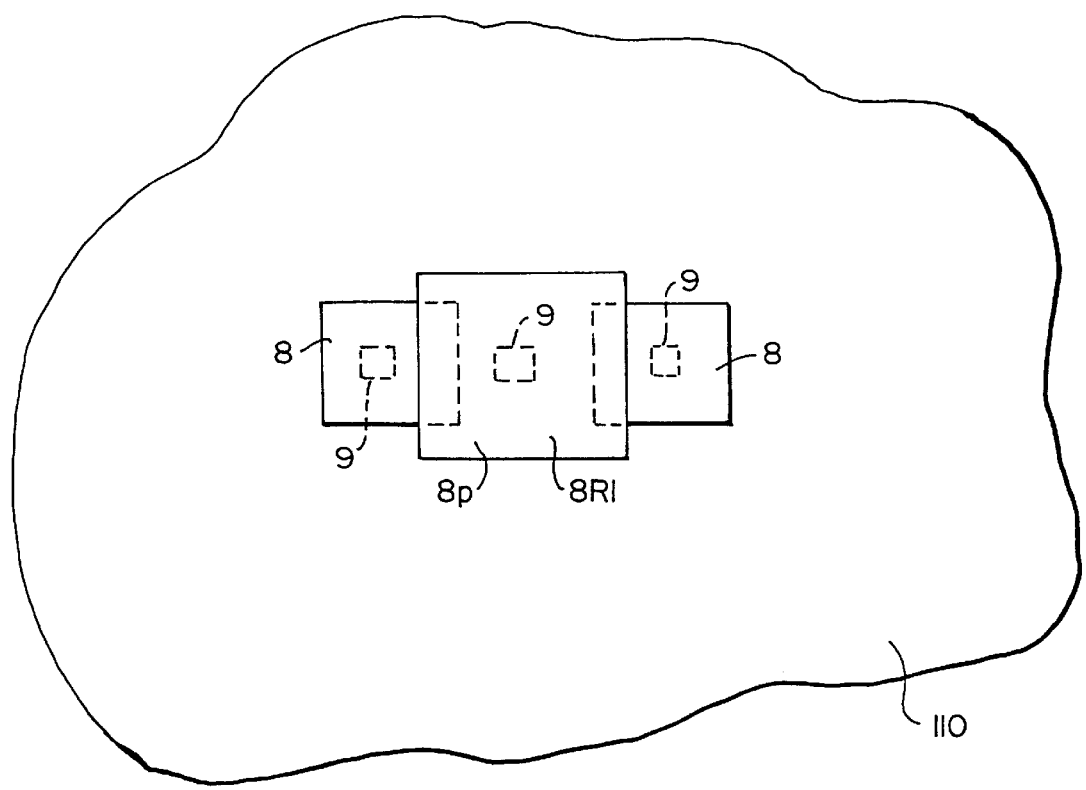
FIG. 20 is a horizontal view taken in direction of the arrows and along the plane of line 20—20 in FIG. 19.
Figure 21:
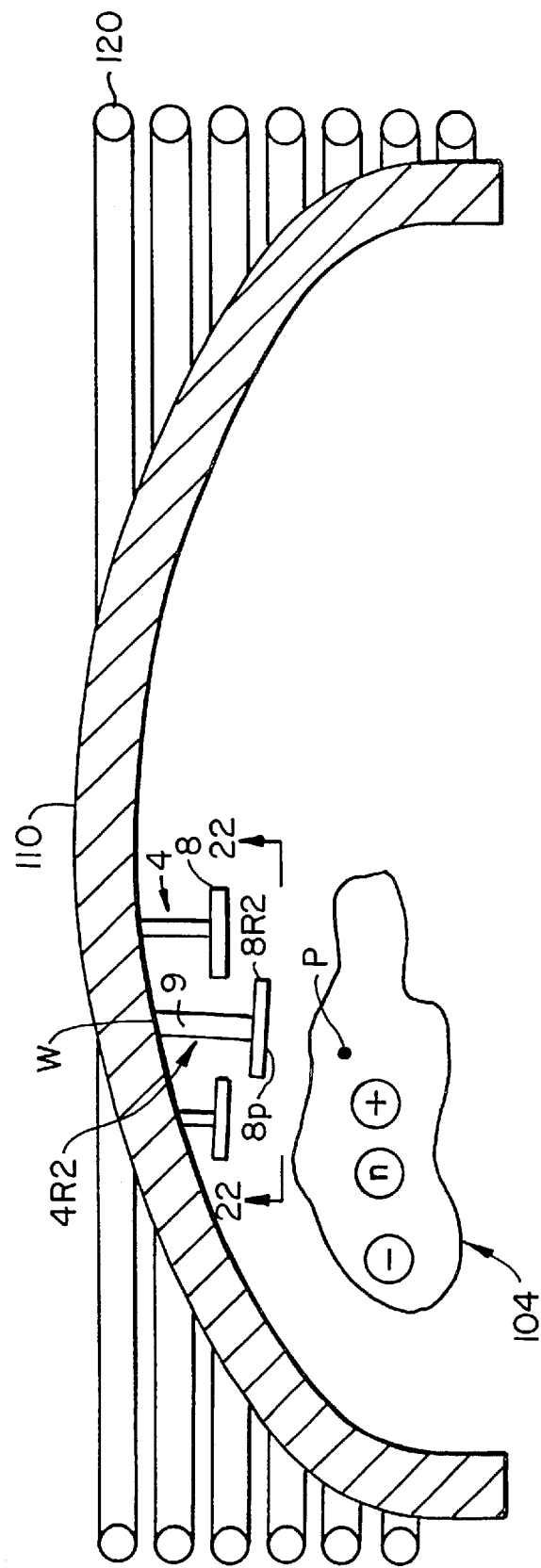
FIG. 21 is the vertical sectional view of the dome-shaped dielectric ceiling from FIG. 12 after one of the assemblies including a deposition support member has been removed from the inside surface of the dome-shaped dielectric ceiling and replaced with another assembly having a deposition support member with a planar surface area smaller or less than a planar surface area of the deposition support member from the assembly which was removed, in order to increase the density of the plasma at and/or in proximity to the point P in the plasma.
Figure 22:
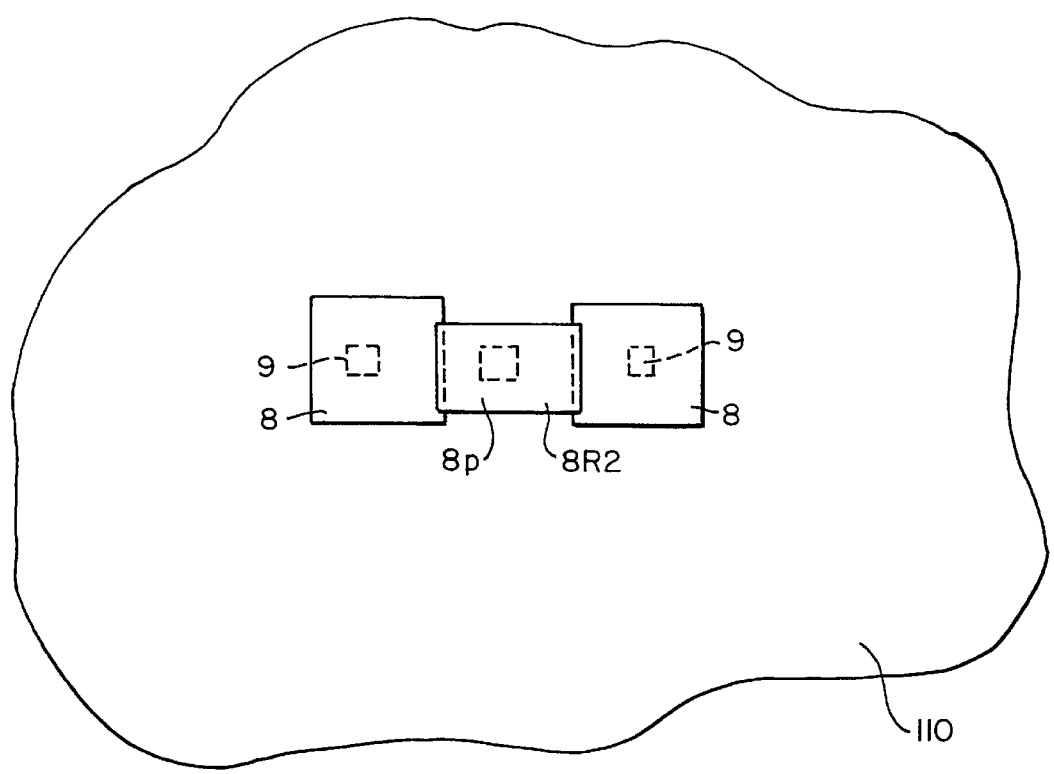
FIG. 22 is a horizontal taken in direction of the arrows and along the plane of line 22—22 in FIG. 21.

In another embodiment of a method for adjusting the density of plasma and referring in detail now to FIGS. 17–22, there is seen in FIG. 17 a vertical sectional view of the dome-shaped dielectric ceiling 110 of the inductively coupled RF plasma reactor 100 of FIG. 12, with the inside surface of the dielectric ceiling 110 having secured thereto and depending therefrom a plurality of the assemblies 4. The reactor chamber 102 including the dielectric ceiling 110 contains the high density plasma 104 whose density is to be adjusted at and/or in proximity to a point P within the plasma 104. One of the assemblies 4 which is closest to the point P in the plasma 104 has been conveniently designated as assembly 4R (see FIG. 17) and includes a brace 9 attached at a spot W on the inside surface of the dielectric ceiling 110. This particular brace 9 supports a deposition support member 8R having a face 8P in the general form of a square for illustration purposes only. After it has been determined that the density of the high density plasma 104 should be adjusted at a location within the reactor 102 in proximity to spot W, which is in proximity to point P within the high density plasma 104, processing power to the coil conductor 120 from the RF generator 136 through the conventional active RF match network 140 is interrupted by being shut down. The dielectric ceiling 110 is removed from engagement with the conductive sidewall 108 and assembly 4R is removed from spot W; or alternatively, deposition support member 8R is removed from the particular brace 9 which supports the same. Depending on whether the density of the plasma 104 at point P is to be reduced or increased, the removed assembly 4R is to be replaced by assembly 4R1 (see FIGS. 19 and 20) or by assembly 4R2 (see FIGS. 21 and 22); or the removed deposition support member 8R is to be replaced by deposition support member 8R1 or by deposition support member 8R2.

The deposition support member 8R1 of assembly 4R1 has a face 8p with a larger or greater than surface area than the surface area of face 8p of deposition support member 8R of assembly 4R. Deposition support member 8R2 has a face 8p with a surface area that is smaller or less than the surface area of the face 8p of the deposition support member 8R of assembly 4R. If the density of the plasma 104 at point P is to be decreased, then deposition support member 8R1 is to replace deposition support member SR or the assembly 4R1 with deposition support member 8R1 is to replace the assembly 4R with the deposition support member 8R. Similarly, if the density at point P in plasma 104 is to be increased, then deposition support member 8R2 is to replace deposition support member 8R, or assembly 4R2 with deposition support member 8R2 is to replace the assembly 4R having deposition support member 8R. Stated alternatively, replacing assembly 4R with an assembly that has a deposition support member having a face 8p with a greater surface area reduces the density of the plasma 104 at point P when processing power from the coil conductor 120 is reintroduced through the dielectric ceiling 110 and into the reactor chamber 102. Similarly, replacing the assembly 4R with an assembly that has a deposition support member having a face 8p with a smaller surface area, increases the density plasma 104 at point P when processing power from the coil conductor 120 is reintroduced through the dielectric ceiling 110 and into the reactor chamber 102. It is to be understood that whenever "a greater surface area" or "a surface area that is larger than", or the like, is stated or used in the specification and/or in the claims with respect to a particular face 8p of a particular deposition support member 8R1, such terms broadly mean that the particular deposition support member 8R1 has a different geometric structure (e.g. a longer width/breadth or longer length, etc.) then the geometric structure of the deposition support member 8R which was replaced by the particular deposition support member 8R1 such that the waves of energy from the power transfer have to travel a longer or greater distance to curve or bend around the particular deposition support member 8R1 (see arrows E in FIG. 5) than for replaced deposition support member 8R. Similarly, whenever "a smaller surface area" or "a surface area that is smaller than", or the like, is stated or used in the specification and/or in the claims with respect to a particular face 8p or a particular deposition support member 8R2, such terms broadly mean that the particular depositions support member 8R2 has a different geometric structure (e.g. a shorter width/breadth or shorter length, etc.) than the geometric structure of the deposition support member 8R which was replaced by the particular deposition support member 8R2 such that the waves of energy from the power transfer travel a shorter or smaller distance to curve or bend around the particular deposition support member 8R2 than for replaced deposition support member 8R.

After the processing power from the coil conductor 120 has been reintroduced, the process power may be interrupted or shut down again. The dielectric ceiling 110 may be removed and the deposit of material (i.e. deposit 7) from the deposition support members 8 may be removed or cleaned therefrom. While this alternate embodiment of the present invention has been described employing an inductively coupled RF plasma reactor, i.e. inductively coupled RF plasma reactor 100 of FIGS. 12 and 13, it is to be understood that the spirit and scope of the present invention includes the use of the assemblies 4 and assemblies 4R or 4R1 or 4R2 on dielectric members of other prior art plasma processing reactors (e.g. ECR source reactors, helicon source reactors, helical resonator reactors, etc.) employing other types of processing power (e.g. magnetron power, microwave power, etc.). It is also to be understood while this embodiment of the present invention has been described as removing a single assembly 4R and replacing the same with assembly 4R1 or 4R2 for adjusting the density of the plasma, the spirit and scope of the present invention would include the employment of a plurality of removed assemblies 4R and a plurality of replacement assemblies for adjusting the density of plasma.

Figure 23:
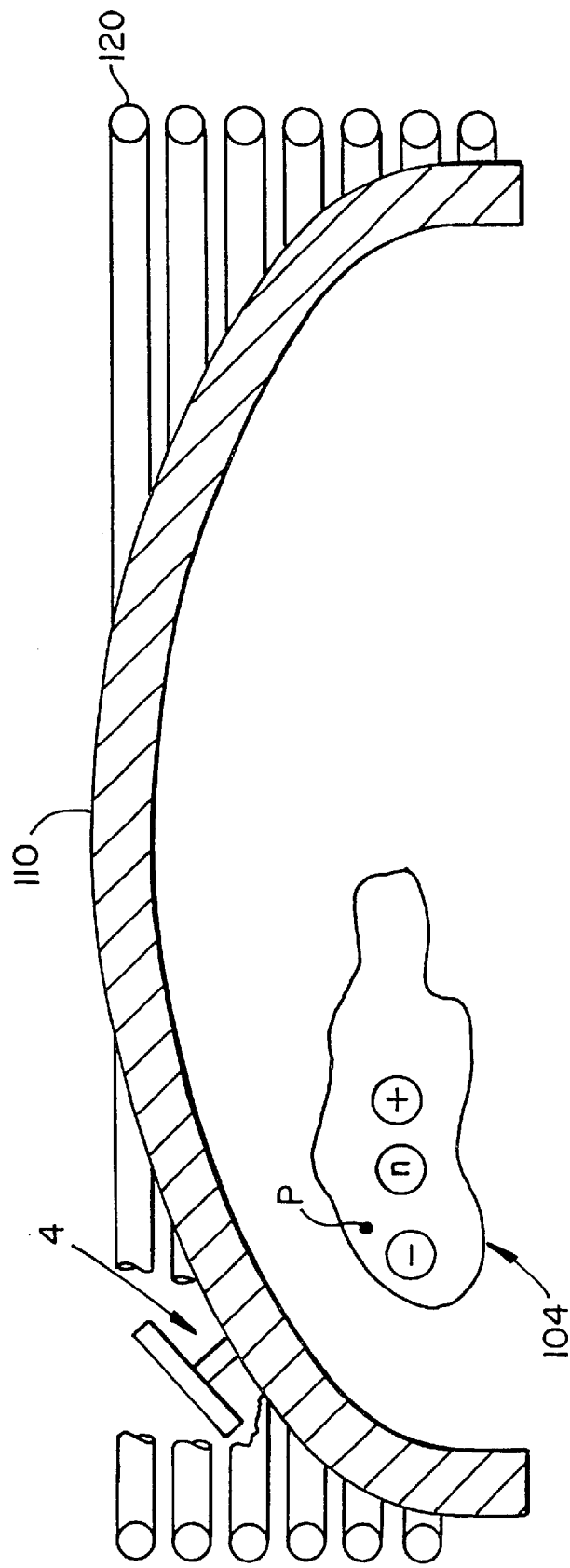
FIG. 23 is a vertical sectional view of the dome-shaped dielectric ceiling of the inductively coupled RF plasma rector of FIG. 12, with an assembly secured to a certain situs on the outside surface of the dielectric ceiling for engaging and interfering with processing power such that the density of the plasma at and/or in proximity to a point P within the plasma has been adjusted.
Figure 24:
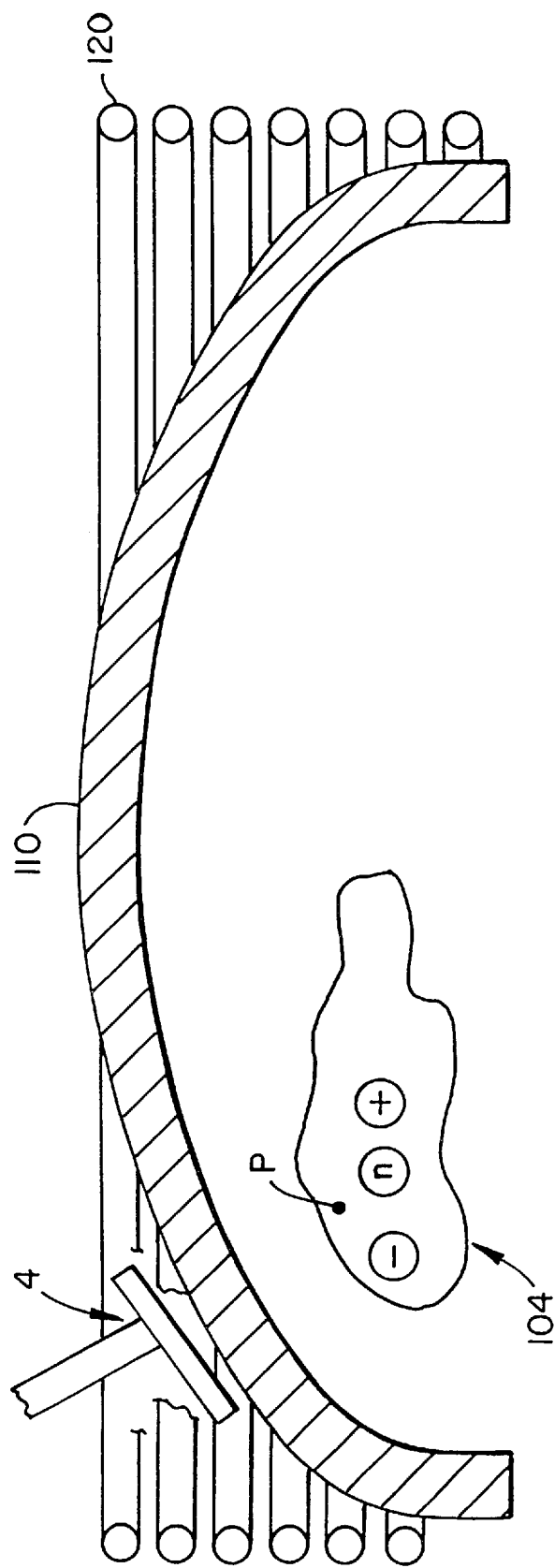
FIG. 24 is vertical sectional view of the dome-shaped dielectric ceiling of the inductively coupled RF plasma reactor of FIG. 12 after an assembly has been positioned away from and not supported by a certain situs on the outside surface of the dielectric member in order to adjust the density of the plasma at and/or in proximity to a point P in the plasma.

Still another embodiment of the present invention and referring in detail now to FIGS. 23–24, there is seen a vertical sectional view of the dielectric ceiling 110 of the inductively coupled RF plasma reactor 100 of FIG. 12, having assembly 4 secured to a certain situs on the outside surface of the dielectric ceiling 110 for engaging and interfering with processing power emanating from the coil conductor 120 such that the density of the plasma density 104 at and/or in proximity to a point P within the plasma 104 has been adjusted. Alternatively with respect to this embodiment of the invention, there is seen in FIG. 24 a vertical sectional view of the dielectric ceiling 110 of the inductively coupled RF plasma reactor 100 of FIG. 12, after assembly 4 has been positioned away from and not supported by the certain situs of the outside surface of the dielectric ceiling 110 in order to adjust the density of the plasma 104 at and/or in proximity to a point P in the plasma.

As was previously indicated, while the use of at least one of the assemblies 4 for various embodiments of the present invention has been described employing an inductively coupled RF plasma reactor (e.g. inductively coupled RF plasma reactor 100 of FIGS. 12 and 13), it is to be understood that the spirit and scope of the present invention includes the use of at least one of the assemblies 4 with other prior art plasma processing apparatuses (e.g. ECR source reactors, helicon course reactors, helical resonator reactors, etc.) employing other types of processing power (e.g. magnetron power, microwave power, etc.).

The invention will be illustrated by the following set forth examples which are being given to set forth the presently known best mode and by way of illustration only and not by way of any limitation. All parameters such as concentrations, dimensions, mixing proportions, temperatures, pressure, rates, compounds, etc., submitted in this example are not to be construed to unduly limit the scope of the invention.

EXAMPLE I

Figure 25:
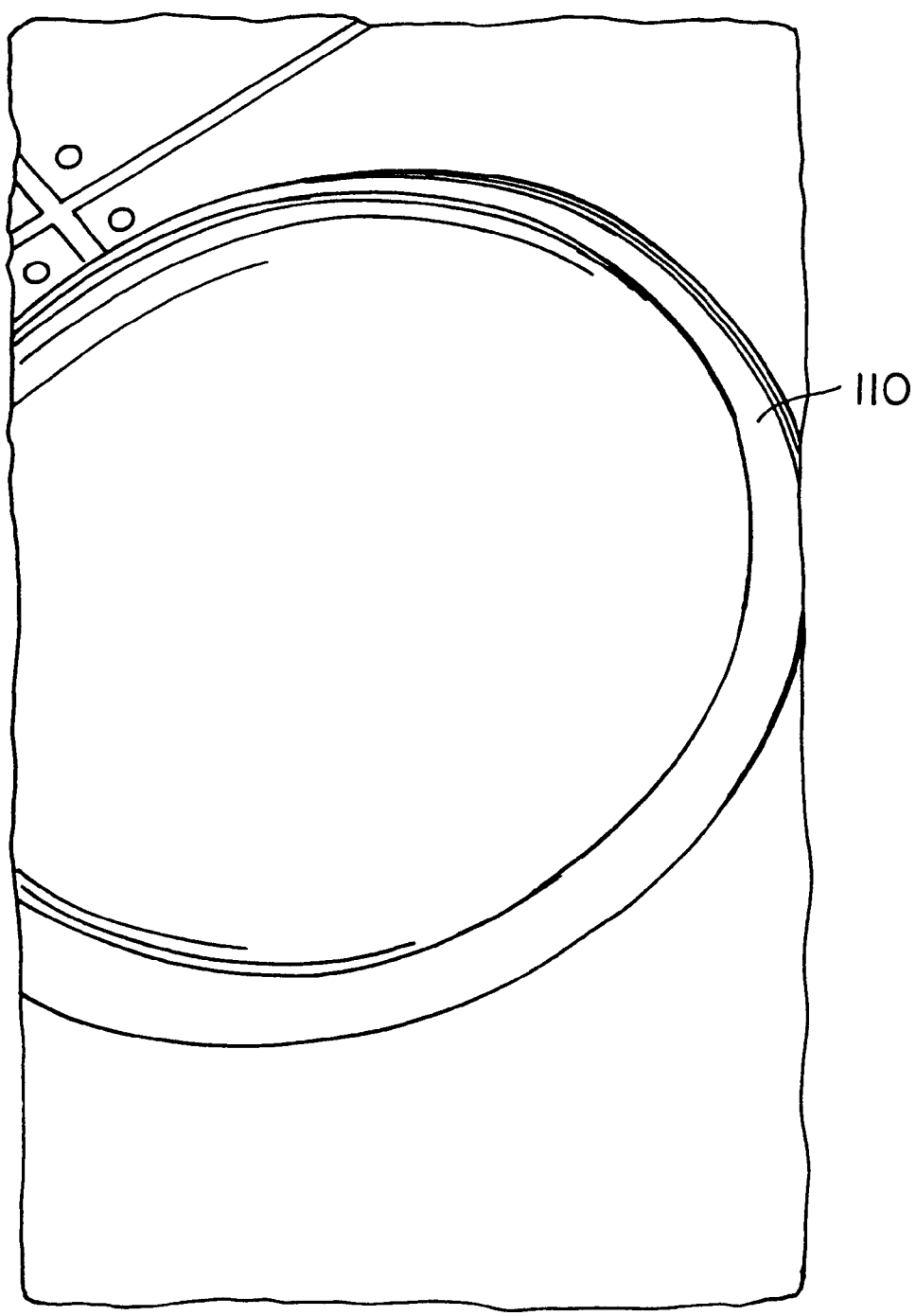
FIG. 25 is a partial perspective view of a dome-shaped dielectric ceiling without any of the assemblies of the present invention attached thereto.

The plasma processing apparatus for this Example was a Metal Etch DPS Centura™ brand plasma processing apparatus possessing a DPS™ brand chamber and sold by Applied Materials Inc., 3050 Bowers Avenue, Santa Clara, Calif. 95054-3299. The DPS™ brand chamber included an etch chamber and a generally hemispherical shaped standard dome as shown in FIG. 25 manufactured of a dielectric aluminum oxide that was capable of allowing RF power to pass therethrough for being coupled to a plasma of an etchant gas. The hemispherical shaped standard dome (hereinafter "Standard Dome") covered the etch chamber as a lid as represented in FIGS. 12 and 13 and sealed the chamber for pumping down to mTorr vacuum pressure. The inductive coils circled the outside of the hemispherical sloped dome and connected to a RF power supply. RF power energy delivered to the inductive coils were transmitted through the Standard Dome and into the DPS™ brand chamber and generated a high density plasma from a processing gas for processing semiconductor wafers.

The Standard Dome was tested with a plurality of 6-inch size aluminum wafers and with a plurality of 6-inch size $SiO_2$ wafers. The aluminum wafers were formulated with the following film stack:

75 $\mu$m Al/Si substrate

The $SiO_2$ wafers were formulated with the following film stack:

1 $\mu$m $SiO_2$/Si Substrate

The processing gas was argon (Ar) and the approximate DPS™ brand chamber conditions for testing the Standard Dome were as follows:

| Pressure, mTorr | 7 to 10 mTorr |
| --- | --- |
| RF Power to Coil Inductor | 500 to 1000 watts |
| RF Power to Wafer Pedestal | 400 to 490 watts |
| RF Frequency of Coil Inductor | 2 MHz |
| RF Frequency of Wafer Pedestal | 13.56 MHz |

The aluminum wafers were disposed in the DPS™ brand chamber and were etched for 5 minutes and subsequently removed therefrom. The $SiO_2$ wafers were then placed in the same DPS™ brand chamber, and were etched for 2 minutes and also subsequently removed therefrom. This alternating procedure of 5 minute etching of Al wafers followed by 2 minute etching of $SiO_2$ wafers was continuously repeated for about 100 minutes to monitor the affect of Al/$SiO_2$ by-product deposition on the inside surface of the Standard Dome vs. the etch rate on the $SiO_2$ wafers.

The process conditions (based on the flow rate of Ar) for the etching of the aluminum wafers were as follows:

| Ar | 75 sccm |
| --- | --- |
| Pressure | 7 to 10 mTorr |
| Temperature of Wafer | 110° C. |
| Aluminum Deposit Rate on Dome | 300 Å/min. |

The process conditions (also based on the flow rate of Ar) for the etching of $SiO_2$ wafers were as follows:

| Ar | 75 sccm |
| --- | --- |
| Pressure | 7 to 10 mTorr |
| Temperature of Wafer | 110° C. |
| $SiO_2$ Etch Rate on Wafer | 1000 to 1400 Å/min. |

Etch rates on the $SiO_2$ wafers were monitored to check the effect of Al/$SiO_2$ by-product conductive film deposition on the inside surface of the Standard Dome. If the Al/$SiO_2$ by-product conductive film deposition on the inside surface of the Standard Dome affects the RF power energy transmission from the coil inductor, a drop in the $SiO_2$ etch rate (i.e. Tox ER) would be observed. The test results obtained from the Standard Dome are shown in the Table I below:

TABLE I

| RF-on Time (minutes) | Standard Dome, Tox ER (Å/min.) |
| --- | --- |
| 0 | 1338 |
| 5 | 1271 |
| 10 | 1282 |
| 15 | 1333 |
| 20 | 1316 |

TABLE I-continued

| RF-on Time (minutes) | Standard Dome, Tox ER (Å/min.) |
| --- | --- |
| 25 | 1272 |
| 30 | 1217 |
| 35 | 1225 |
| 40 | 1206 |
| 55 | 1106 |
| 60 | |
| 70 | 908 |
| 80 | |
| 85 | 788 |
| 100 | 783 |
| 110 | |

Figure 27:
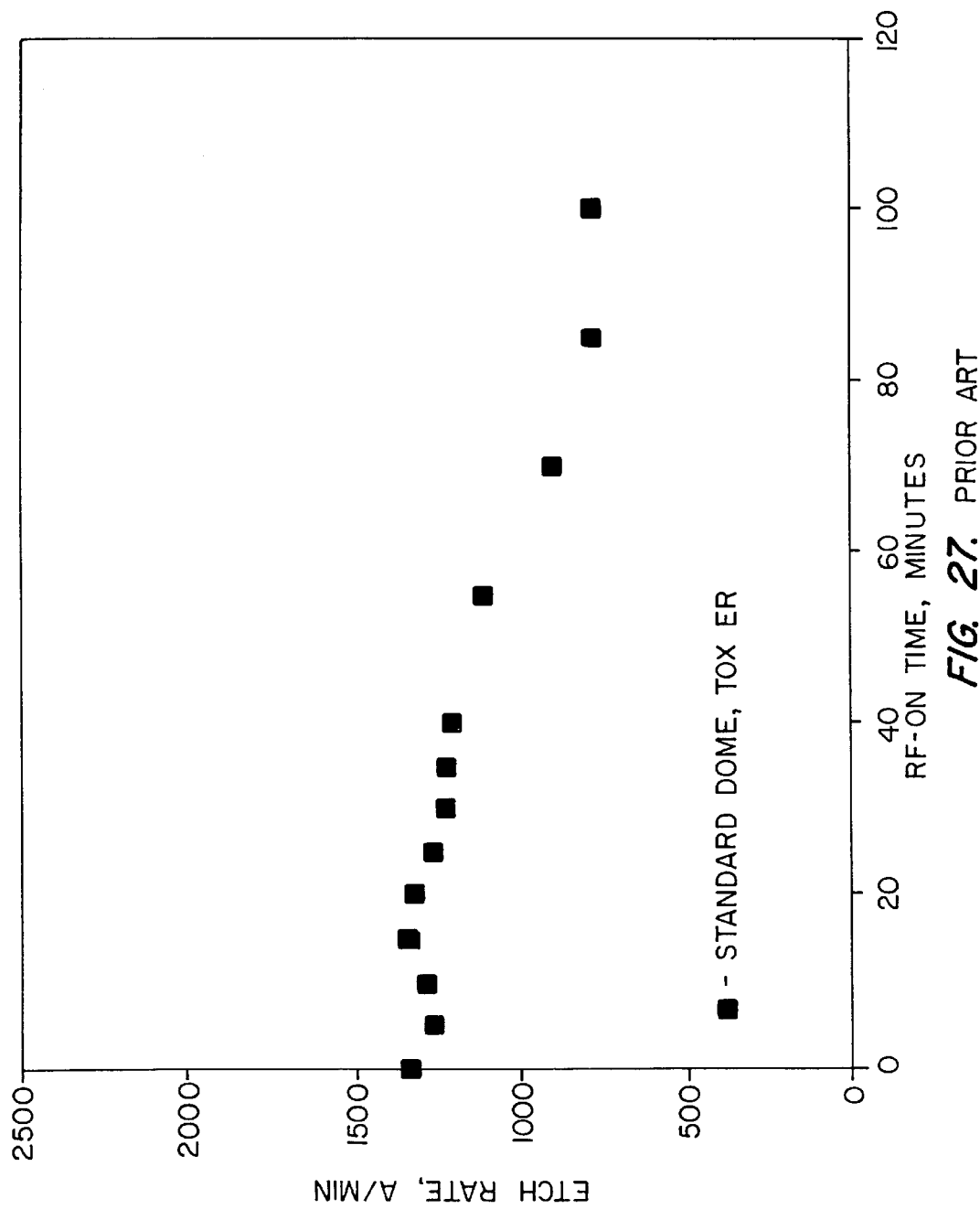
FIG. 27 is a plot of the results for the Standard Dome from Table I in Example I illustrating $SiO_2$ etch rate (Tox ER, Å/min.) vs. RF-on time (mins.)

FIG. 27 is a plot of the results from Table I illustrating $SiO_2$ etch rate (Tox ER, Å/min.) vs. RF on-time, minutes. The FIG. 27 graph clearly shows that the $SiO_2$ etch rate began to precipitously decline after about 35 minutes of RF-on time because of the Al/$SiO_2$ by-product conductive film on the inside surface of the Standard Dome.

EXAMPLE II

Figure 26A:
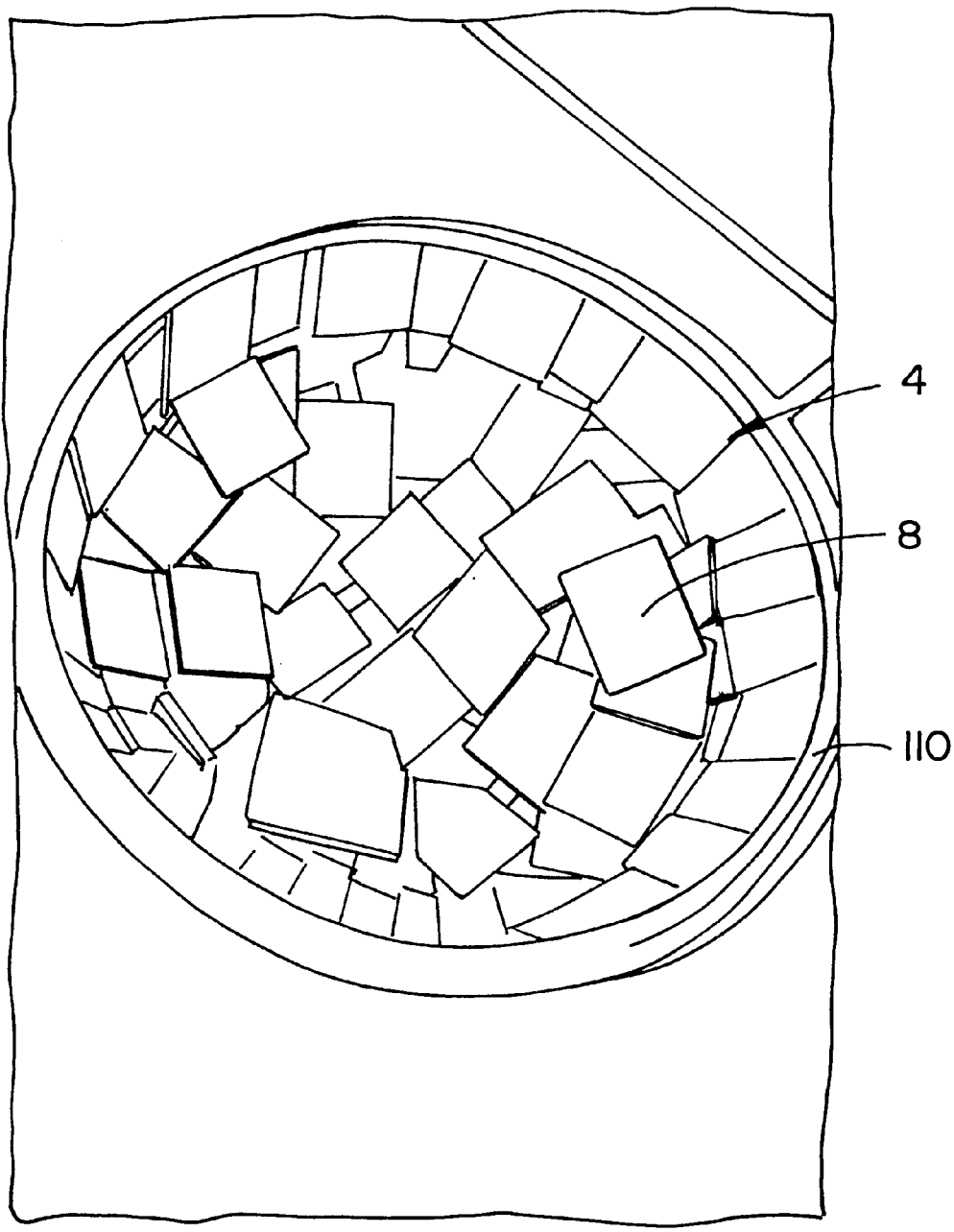
FIG. 26A is a perspective view of the dome-shaped dielectric ceiling of FIG. 25 after a plurality of the assemblies having been connected to an inside surface of the dielectric ceiling in order to allow stable power transmission to pass through the dielectric ceiling and into a processing chamber and for receiving and supporting a deposit of materials during processing of a semi-conductor wafer in a process chamber supporting the dielectric ceiling.
Figure 26B:
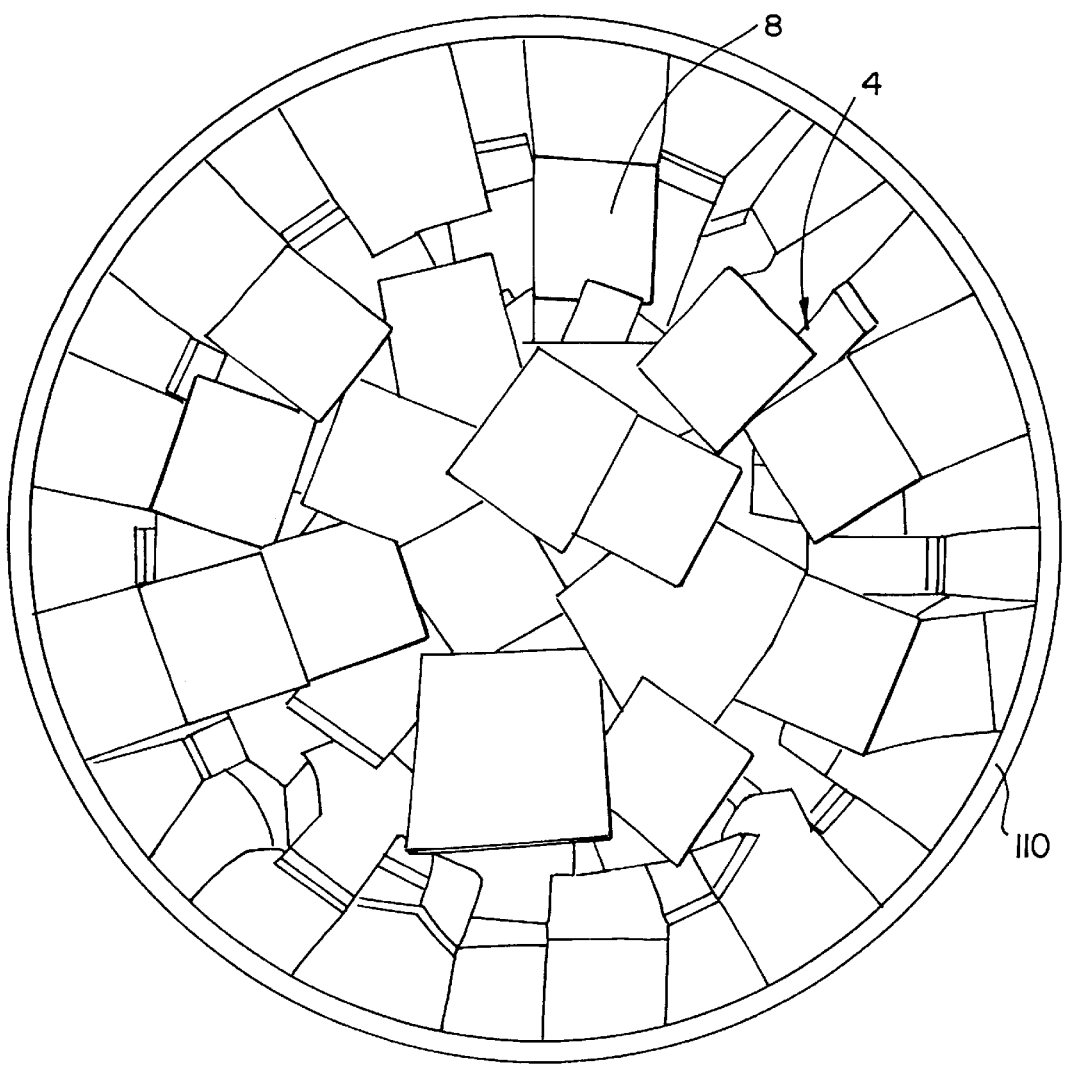
FIG. 26B is another perspective view of the dome-shaped dielectric ceiling of FIG. 26A.
Figure 26C:
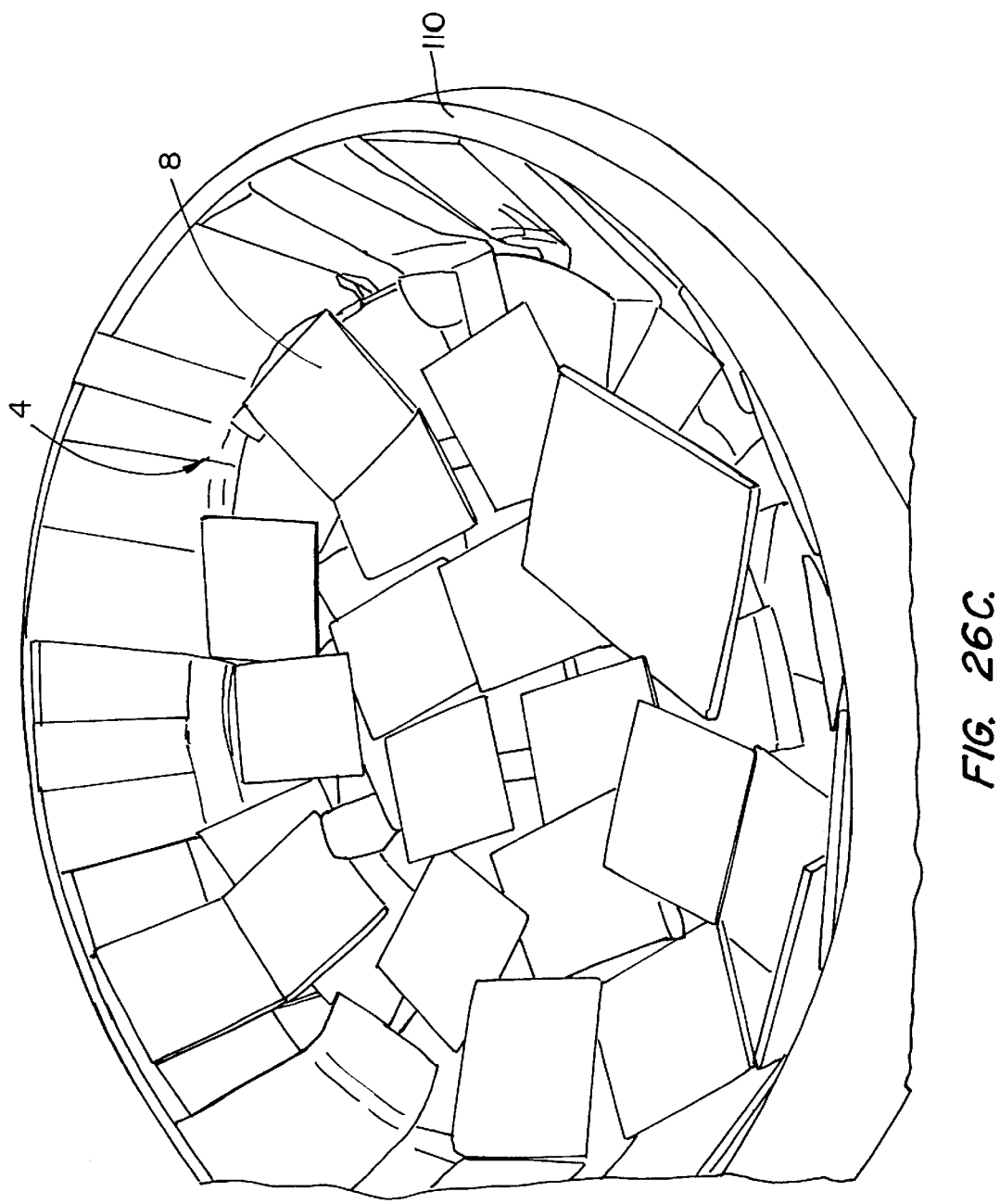
FIG. 26C is also another perspective view of the dome-shaped dielectric ceiling of FIG. 26A.

Example I was repeated but with a Modified Dome and with 6-inch size platinum (Pt) wafers replacing the 6-inch size $SiO_2$ wafers. The Modified Dome for this Example II used the Standard DPS Dome from Example I, but whose inside surface had a plurality of braces secured thereto. FIG. 26A, 26B and 26C are perspective views of the Modified Dome. Each brace supported a special metal piece. The first three assemblies (i.e. assemblies 4) in the side elevational view of FIG. 1 are representative of the manner in which the braces connected to the inside surface of the Modified Dome and of the manner in which the special metal pieces connected to the braces. The special metal pieces were each approximately 5 cm×5 cm sq. and 0.03 cm thick. They were made of 5052 series aluminum with 0.0025 cm thick dielectric aluminum oxide on all the surfaces. The braces were made of aluminum and varied in length from about 0.02 cm to about 1.0 cm. The aluminum braces were attached to the inside surface of the standard DPS dome by high temperature adhesive glue. The metal pieces, as they were supported by the braces, overlapped each other and no contact was made with each other. The gap between all the metal pieces was about 0.05 cm. The overlap between all the metal pieces was about 0.5 cm.

The aluminum wafers were again 6-inch size and had the same film stack of: 75 $\mu$m Al/Si substrate. The 6-inch size platinum wafers had the following film stack:

6000 Å Pt/300 Å TiN/5000 Å $SiO_2$/Si substrate.

The processing gas was again argon (Ar) and the approximate DPS™ brand chamber conditions for testing the Modified Dome were the same as for the Standard Dome of Example I, which more particularly were as shown in Example I:

| Pressure, mTorr | 7 to 10 mTorr |
| --- | --- |
| RF Power to Coil Inductor | 500 to 1000 watts |
| RF Power to Wafer Pedestal | 400 to 490 watts |
| RF Frequency of Coil Inductor | 2 MHz |
| RF Frequency of Wafer Pedestal | 13.56 MHz |

A similar alternating procedure employed for the Al wafers and $SiO_2$ wafers of Example I were repeated for the Al wafers and the Pt wafers of the present Example II. More specifically, the aluminum wafers were disposed in the DPS™ brand chamber and were etched for 20 minutes and subsequently removed. The platinum wafers were then placed in the same DPS™ brand chamber, and were etched for 30 seconds and subsequently removed. This alternating procedure of 20 minute etching of Al wafers followed by 30 seconds etching of Pt wafers was continually repeated for about 110 minutes to monitor the affect of the Al/Pt by-product deposition on the special metal pieces vs. the etch rate on the Pt wafers.

The process conditions (based on the flow rate of Ar) for the etching of the aluminum wafers were as follows:

| | |
|---|---|
| Ar | 75 sccm |
| Pressure | 7 to 10 mTorr |
| Temperature of Wafer | 110° C. |
| Aluminum Deposit Rate on Dome | 300 Å/min |

The process conditions (also based on the flow rate of Ar) for the etching of platinum wafers were:

| | |
|---|---|
| Ar | 75 sccm |
| Pressure | 7 to 10 mTorr |
| Temperature of Wafer | 110° C. |
| Pt Etch Rate on Wafer | 2000 to 2500 Å/min. |

Etch rates on the Pt wafers were monitored to check the effect of Al/Pt conductive film deposition on the metal pieces which were coupled to the inside surface of the Modified Dome. If the Al/Pt conductive film deposition on the metal pieces affects the RF power energy transmission from the coil inductor, a drop in Pt etch rate on the Pt wafers would be observed. The test results obtained from the Modified Dome are shown in Table II below:

TABLE II

| RF-on Time (minutes) | Modified Dome, Pt ER (Å/min.) |
|---|---|
| 0 | 2040 |
| 5 | |
| 10 | |
| 15 | |
| 20 | 2000 |
| 25 | |
| 30 | |
| 35 | |
| 40 | 1880 |
| 55 | |
| 60 | 1960 |
| 70 | |
| 80 | 1950 |
| 85 | |
| 100 | 1920 |
| 110 | 1940 |

Figure 28:
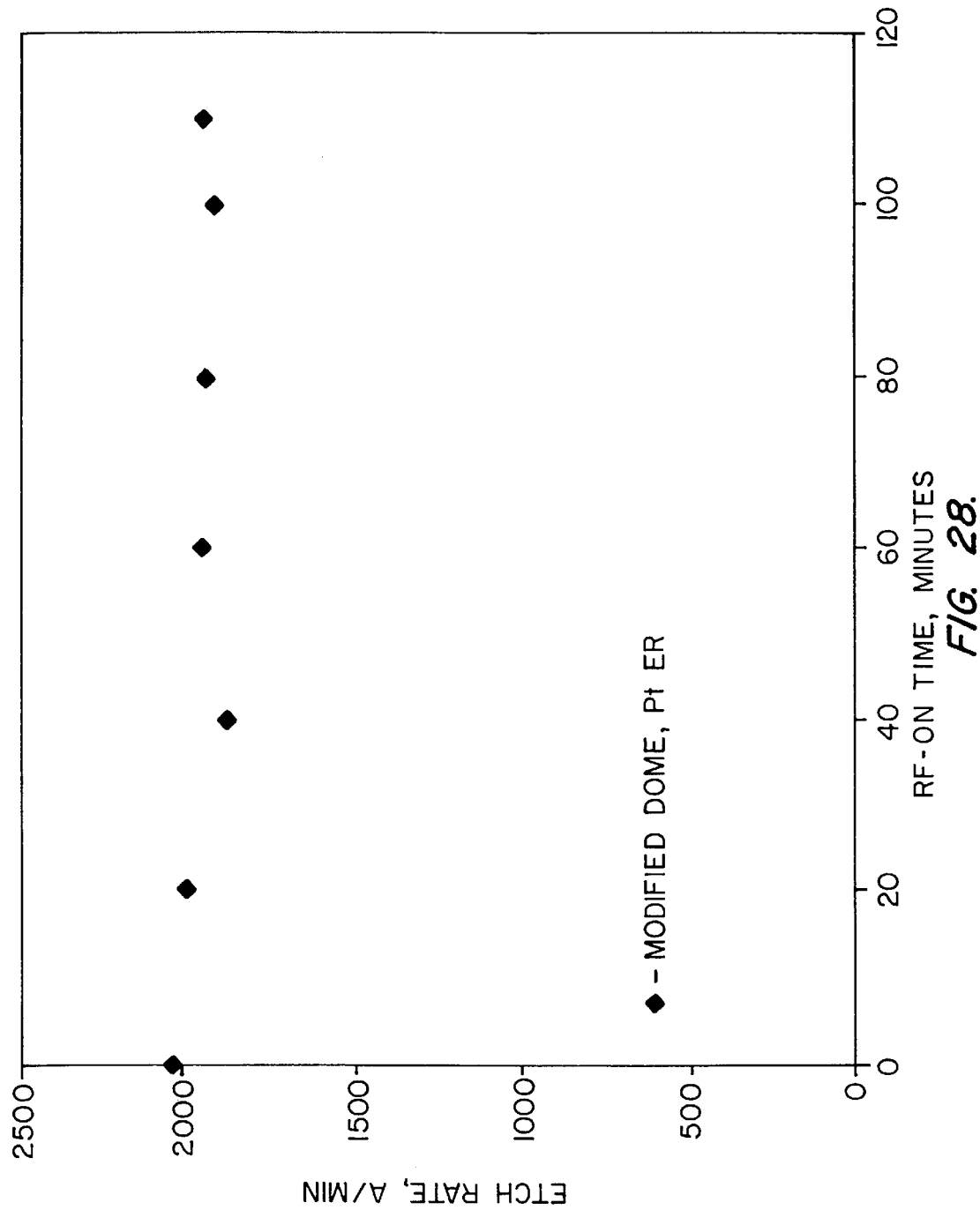
FIG. 28 is a plot of the results for the Modified Dome from Table II in Example II illustrating PT etch rate (Å/min.) vs. RF-on time (mins.).

FIG. 28 is a plot of the results from Table II illustrating the Pt etch rate vs. RF-on time, minutes. FIG. 28, as well as Table II above, illustrate that with the Modified Dome, there was no essential decrease in the Pt etch rate after about 100 minutes of RF-on time. The Al/Pt conductive film deposition on the metal pieces did not substantially affect the RF power energy transmission from the coil inductor through the Modified Dome and into the DPS™ brand chamber; thus, there was no substantial decrease in Pt etch rate on the Pt wafers. The fact that Pt wafers were used for this Example II instead of the SiO$_2$ wafers from Example I is more supportive of the fact that the overlapping and spaced special metal pieces provided and allowed a generally stable RF power transmission through the Modified Dome and into the DPS™ brand chamber because the Al/SiO$_2$ by-products deposited on the inside surface of the Standard Dome from Example I would not have been as conductive, and thus would not have been as an effective Faraday shield, as the Al/Pt by-products disposed on the special metal pieces of the Modified Dome. The Modified Dome provided a longer, more stable etch rate.

CONCLUSION

Therefore, by the practice of the present invention there is provided an assembly 4 for allowing stable power transmission into a plasma processing chamber. The material deposition support members 8 of the assembly 4 receive and support the deposition of materials (i.e. deposit 7 of materials) which are electrical conductive by-products from processing (e.g. metal etching) of a substrate (i.e. semiconductive wafer 13) in a process chamber having a controlled environment in containing a plasma of a processing gas. There is also provided a liner assembly 11 having a plurality of assemblies 4 secured thereto. The assembly 4 prevents the deposition of materials on the dielectric member 6 (e.g. dielectric window or ceiling 110) from becoming generally continuous during processing of the semiconductor wafer 13 in a process chamber and generally allows waves of power energy to pass uninterruptedly through the dielectric member 6. By the practice of the present invention there is also provided a plasma reactor for processing substrates, more particularly an inductively coupled RF plasma reactor for processing semiconducting wafers. By the further practice of the present invention there is provided a method for adjusting the density of plasma contained within a process chamber wherein substrates are to be processed. A method of processing a metal layer disposed on a substrate is also provided by the practice of the present invention.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope of the invention as set forth.

We claim:

1. A method of adjusting the density of plasma contained in a chamber wherein substrates are to be processed comprising:
   a) providing a chamber containing a plasma processing gas for processing at least one substrate and said chamber including a chamber wall having a dielectric member releasably engaged thereto;
   b) introducing processing power through said dielectric member and into an interior of said chamber to process at least one substrate in said plasma processing gas having a first plasma density;
   c) interrupting the introducing of said processing power through said dielectric member and into said interior of said chamber;
   d) disengaging said dielectric member from said chamber wall;
   e) securing to a certain situs on an inside surface of said dielectric member, a material deposition support assembly for receiving and supporting a deposition of materials during processing of at least one substrate in said chamber;

f) reengaging said dielectric member with said chamber wall; and g) reintroducing processing power through said dielectric member and into said chamber to process at least one substrate in the plasma processing gas having an adjusted, second plasma density.

2. The method of claim 1 wherein said processing power is selected from the group consisting of RF power, microwave power, and combinations thereof.

3. The method of claim 2 wherein said processing power is RF power.

4. The method of claim 1 wherein said reintroducing of processing power through said dielectric member and into said chamber includes adjusting a plasma density at a location in said chamber in proximity to said certain situs on said dielectric member surface.

5. The method of claim 1 wherein said substrate is a semiconductor wafer.

6. The method of claim 1 wherein said material deposition support assembly comprises a plurality of overlapping and spaced deposition support members which are secured to said dielectric member.

7. The method of claim 6 wherein said plurality of overlapping and spaced deposition support members includes at least one material deposition support member overlapping at least two other material deposition support members.

8. The method of claim 1 wherein said at least one material deposition support assembly comprises a material which is a generally non-conductive material.

9. The method of claim 7 wherein a deposit of a material is present on at least one of said deposition support members.

10. The method of claim 9 wherein said deposit of said material comprises an element selected from the group consisting of platinum, copper, aluminum, titanium, ruthenium, iridium, and mixtures thereof.

11. A method of adjusting the density of plasma contained in a chamber where substrates are processed comprising:

a) providing a chamber containing a plasma processing gas for processing at least one substrate, where said chamber wall has a dielectric member releasably engaged theret, and wherein a plurality of material deposition support members are coupled to an inside surface of said dielectric member;

b) introducing processing power through said dielectric member and into said chamber to process at least one substrate in said plasma processing gas having a first plasma density;

c) interrupting said introducing of processing power through said dielectric member and into said chamber;

d) removing said dielectric member from engagement with said chamber wall;

e) removing at least one particular material deposition support member from a certain situs on said surface of said dielectric member;

f) securing at least one replacement material deposition support member to said certain situs on said surface of said dielectric member;

g) reengaging said dielectric member to said chamber wall; and h) reintroducing processing power through said dielectric member and into said chamber, to process said at least one substrate in a plasma processing gas having an adjusted, second plasma density.

12. The method of claim 11 wherein a replacement material deposition support member has a surface area that differs from a surface area of a material deposition support member which is replaced.

13. The method of claim 12 wherein said replacement material deposition support member has a surface area that is larger than a surface area of a material deposition support member which is replaced.

14. The method of claim 13 wherein said reintroducing of process power includes reintroducing processing power through said dielectric member and into said chamber, to process said at least one substrate in said plasma processing gas, wherein said adjusted, second plasma density is less at a location in said chamber in proximity to said certain situs on said dielectric member surface.

15. The method of claim 11 wherein said replacement material deposition support member has a surface area that is smaller than a surface area of a material deposition support member which is replaced.

16. The method of claim 15 wherein said reintroducing of processing power includes reintroducing processing power through said dielectric member and into said chamber, to process said at least one substrate in said plasma processing gas, wherein said adjusted, second plasma density is greater at a location in said chamber in proximity to said certain situs on said dielectric member surface.

17. The method of claim 11 wherein said processing power is selected from the group consisting of RF power, microwave power, and combinations thereof.

18. The method of claim 11 wherein said processing power is RF power.

19. The method of claim 11, wherein a plurality of brace members are secured to said material deposition support members and to said inside surface of said dielectric member.

20. The method of claim 19 wherein said plurality of material deposition support members includes a plurality of overlapping and spaced material deposition support members where at least one material deposition support member overlaps at least two other material deposition support members.

21. The method of claim 20, wherein a deposit of a material is present on at least one of said material deposition support members.

22. The method of claim 21 wherein said deposit of material comprises an element selected from the group consisting of platinum, copper, aluminum, titanium, ruthenium, iridium and mixtures thereof.

23. The method of claim 21 additionally comprising cleaning a deposit of material from at least one material deposition support member.

* * * * *